United States Patent
Iwata et al.

(10) Patent No.: US 7,301,198 B2
(45) Date of Patent: Nov. 27, 2007

(54) SEMICONDUCTOR DEVICE HAVING LOGIC CIRCUITRY AND MEMORY CIRCUITRY ON THE SAME SUBSTRATE, AND ITS USE IN PORTABLE ELECTRONIC EQUIPMENT AND IC CARD

(75) Inventors: Hiroshi Iwata, Nara-ken (JP); Takayuki Ogura, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 134 days.

(21) Appl. No.: 10/842,424

(22) Filed: May 11, 2004

(65) Prior Publication Data

US 2004/0256653 A1    Dec. 23, 2004

(30) Foreign Application Priority Data

May 13, 2003    (JP) .......................... P2003-134642

(51) Int. Cl.
*H01L 29/792* (2006.01)
(52) U.S. Cl. ...................... 257/324; 257/213; 257/288; 257/314; 257/E29.309
(58) Field of Classification Search ...................... None
See application file for complete search history.

(56) References Cited

U.S. PATENT DOCUMENTS 5,838,041 A * 11/1998 Sakagami et al. .......... 257/324
5,898,223 A * 4/1999 Frye et al. .................. 257/777
5,901,080 A * 5/1999 Shouno
6,008,087 A * 12/1999 Wu ............................ 438/257
6,335,554 B1 * 1/2002 Yoshikawa .................. 257/316
6,836,617 B1 * 12/2004 Parulski

FOREIGN PATENT DOCUMENTS

JP    2000-077618 A    3/2000
JP    2001-156188 A    6/2001

\* cited by examiner

*Primary Examiner*—Leonardo Andujar
*Assistant Examiner*—Kevin Quinto
(74) *Attorney, Agent, or Firm*—Birch, Stewart, Kolasch & Birch, LLP

(57) ABSTRACT

A semiconductor switching element and a semiconductor storage element each have a gate electrode, a pair of source/drain regions and a channel forming region. Memory function bodies having a function of storing electric charges are provided on opposite sides of the gate electrode of the semiconductor storage element. In the semiconductor storage element, an amount of current that flows from one of the source/drain regions to the other of the source/drain regions upon application of a voltage to the gate electrode is variable depending on an amount of electric charges retained in the memory function body.

30 Claims, 21 Drawing Sheets

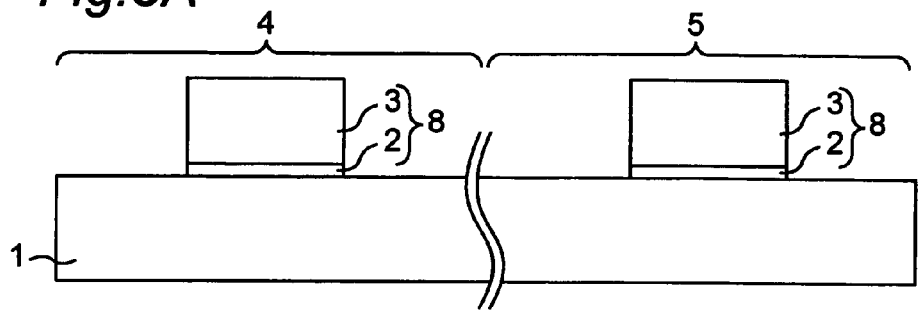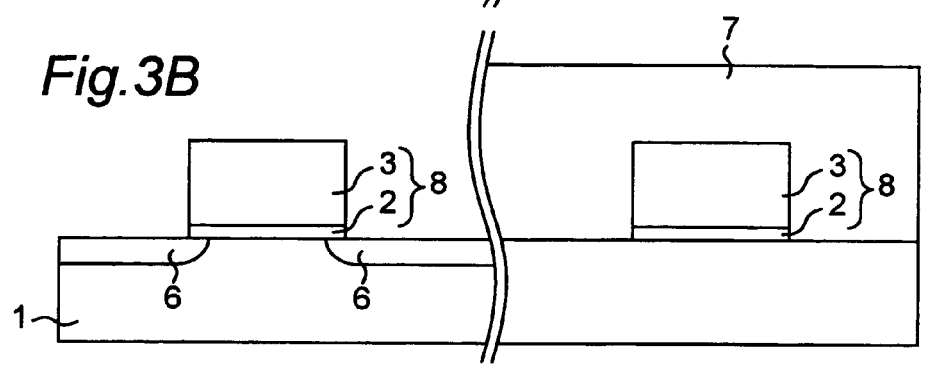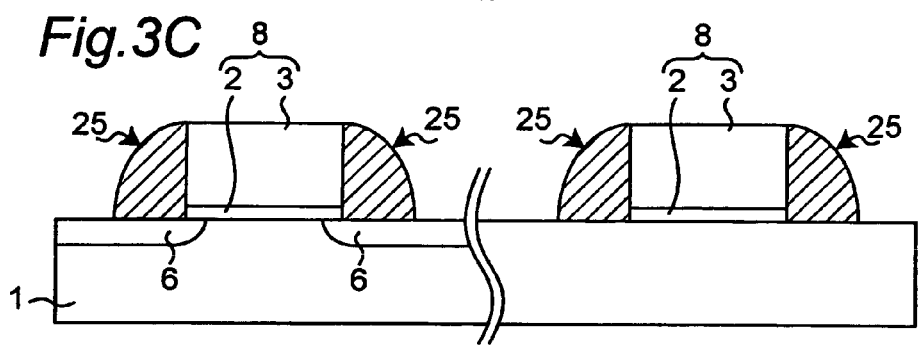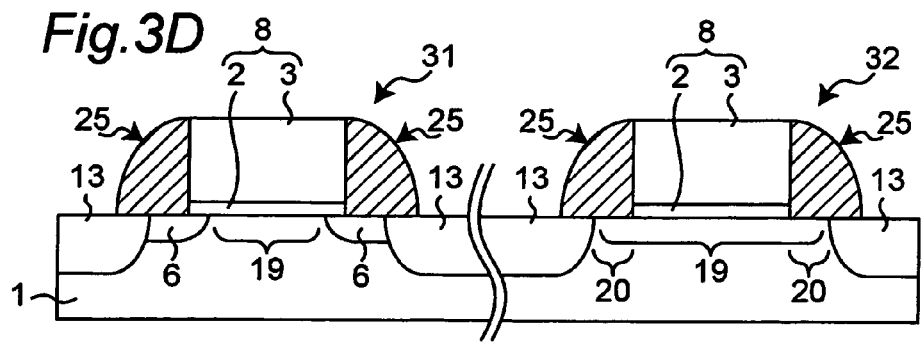

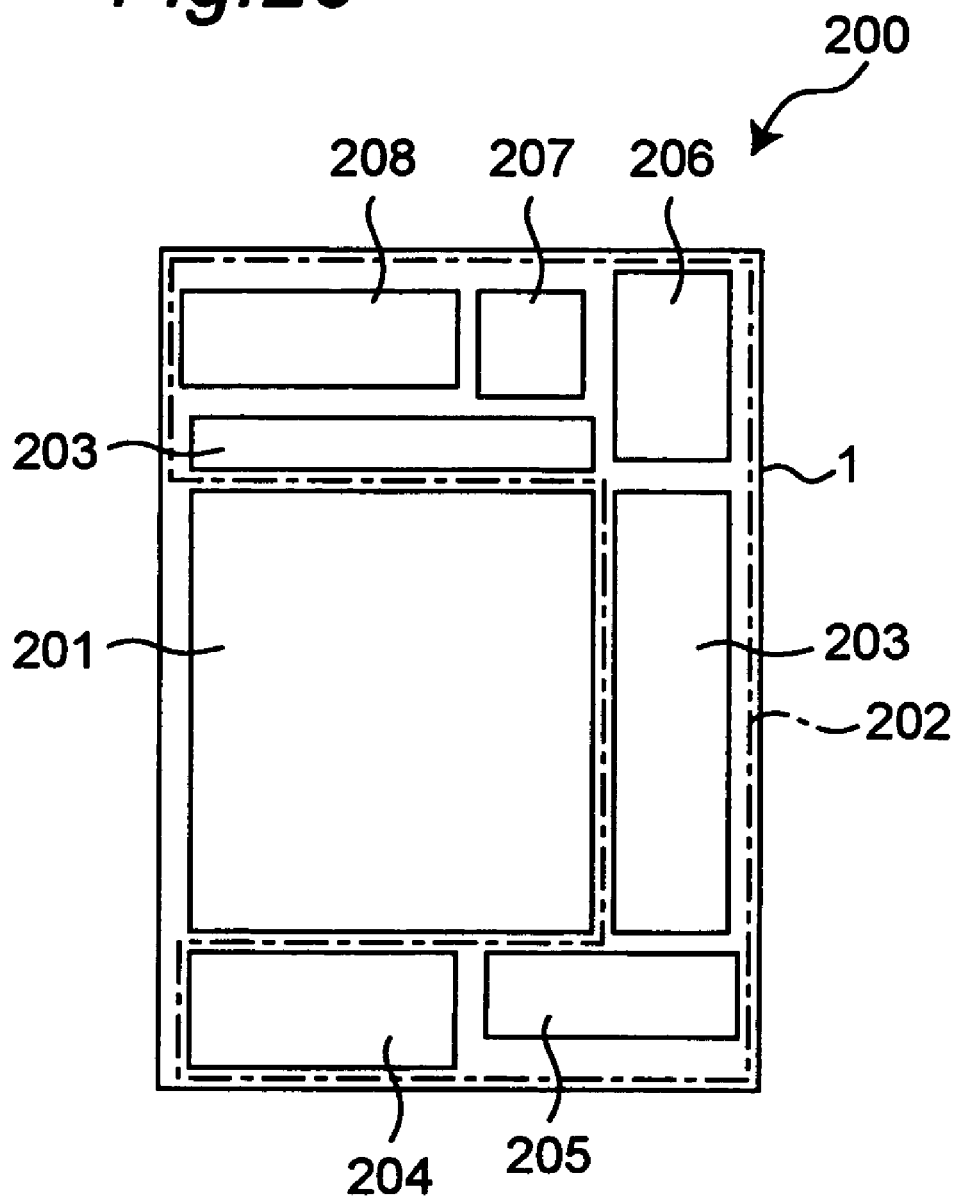

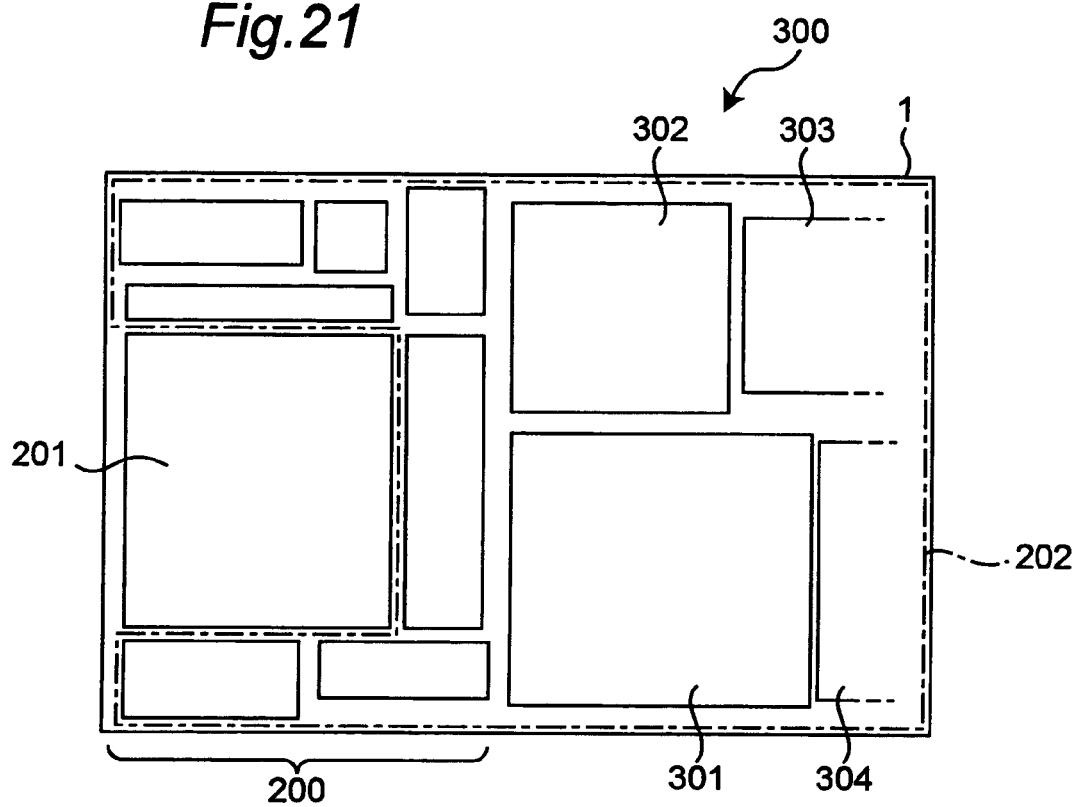

SEMICONDUCTOR DEVICE HAVING LOGIC CIRCUITRY AND MEMORY CIRCUITRY ON THE SAME SUBSTRATE, AND ITS USE IN PORTABLE ELECTRONIC EQUIPMENT AND IC CARD

This nonprovisional application claims priority under 35 U.S.C. § 119(a) on patent application No. 2003-134642 filed in Japan on May 13, 2003, the entire contents of which are hereby incorporated by reference.

BACKGROUND OF THE INVENTION

The present invention relates to a semiconductor device, as well as a manufacturing method therefor, in which semiconductor switching elements constituting a logic circuit area and semiconductor storage elements constituting a storage area are compositely mounted on one substrate.

The present invention also relates to portable electronic equipment and an IC card each provided with such a semiconductor device.

FIG. 1 shows a structural sectional view of a common flash memory. A floating gate 106 made of polysilicon is provided on a P-type well region 101 via a first oxide 104, and a control gate 107 made of polysilicon is provided on the floating gate 106 Via a second oxide 105. On a surface of the P-type well region 101 on both sides of the gate electrodes 106, 107 are formed a first N-type diffusion region 102 and a second N-type diffusion region 103. End portions of the gate electrodes 106, 107 are overlapped with end portions of the first N-type diffusion region 102 and the second N-type diffusion region 103, respectively.

As one mode of the composite mounting of a flash memory and logic circuits, there is also a known technique that memory cells are arranged in an array configuration while, on peripheries of the array, logic circuits serving as peripheral circuits such as a decoder, write/erase circuits and a read circuit are disposed.

There is further a known technique that a logic circuit unit such as MPU (Micro-Processing Unit), an SRAM (Static RAM) unit for use as cache, and the like are provided in order that a memory unit functions as an information processing system for personal computers, portable telephones and the like.

Conventionally, manufacturing a semiconductor device in which a flash memory and logic circuits are compositely mounted would inevitably involve a large extent of cost increase. As to the reason of an increase in manufacturing cost which accounts for the overall cost increase, the composite mounting makes the process more complex, giving rise to a necessity for additional masks. For example, with a flash memory, because of the necessity for two polysilicon layers for memory elements and other reasons, seven to eight masks would have to be added to a standard CMOS manufacturing process.

SUMMARY OF THE INVENTION

Accordingly, a feature of the present invention is to provide a semiconductor device in which semiconductor switching elements constituting a logic circuit area and semiconductor storage elements constituting a memory area are compositely mounted, and which is easy to fabricate with simple process and can be reduced in cost.

Another feature of the invention is to provide a semiconductor device manufacturing method which makes it possible to fabricate with simple process a semiconductor device in which semiconductor switching elements constituting a logic circuit area and semiconductor storage elements constituting a memory area are compositely mounted, and which allows a cost reduction to be achieved.

A further feature of the invention is to provide portable electronic equipment and an IC card each provided with such a semiconductor device.

In order to solve the above problems, in a semiconductor device according to an embodiment of the present invention, a logic circuit area having a semiconductor switching element and a memory area having a semiconductor storage element are disposed on one semiconductor substrate. Each of the semiconductor switching element and the semiconductor storage element has a gate electrode, a pair of source/drain regions of first conductivity type formed on portions of a semiconductor substrate surface corresponding to opposite sides of the gate electrode, and a channel forming region of second conductivity type formed between the source/drain regions. Memory function bodies having a function of storing electric charges are provided on the opposite sides of the gate electrode of the semiconductor storage element. Also, in the semiconductor storage element, an amount of current that flows from one of the source/drain regions to the other of the source/drain regions upon application of a voltage to the gate electrode is variable depending on an amount of electric charges retained in the memory function body.

The memory function bodies on the opposite sides of the gate electrode may be continuous to each other to assume an annular shape. Alternatively, these memory function bodies may be separate so as to be electrically insulated from each other.

In general flash memories, the area for storing electric charge is located below the gate electrode. Thus, such a flash memory only has a capability as a field-effect transistor in which the gate insulator is formed as a thick film. However, the semiconductor storage element of an embodiment of this invention, in which the memory function bodies are located beside the gate electrode, allows an up-to-date MOSFET manufacturing process to be applied thereto. Then, according to an embodiment of this invention, a semiconductor device in which such a semiconductor storage element and a semiconductor switching element are compositely mounted can be provided. Further, the logic circuit part is composed of a plurality of the semiconductor switching elements and the nonvolatile memory part is composed of a plurality of the semiconductor storage elements. Thus, it becomes possible to implement a semiconductor device having the logic circuit part and the nonvolatile memory part which have the above-described effect and advantages and which are readily formed on one identical substrate.

In one embodiment, in the semiconductor switching element, the source/drain regions extend under and overlap with the gate electrode with respect to a channel direction, and in the semiconductor storage element, spacings are provided between the gate electrode and each of the source/drain regions with respect to the channel direction, and the memory function bodies having a function of storing electric charges are disposed on the opposite sides of the gate electrode so as to overlap with the spacings at the semiconductor substrate surface, respectively.

In the semiconductor device of this invention, the logic circuit area having the semiconductor switching element and the memory area having the semiconductor storage element are disposed on the semiconductor substrate. That is, the semiconductor switching element and the semiconductor storage element are compositely formed on the same substrate. The semiconductor storage element is so made that the amount of current that flows from one of the source/drain regions to the other of the source/drain regions is variable depending on the amount of retained electric charge. The semiconductor switching element is configured such that even if it is capable of retaining electric charge, the amount of current that flows from one of the source/drain regions to the other of the source/drain regions is not changed depending on the amount of retained charges to such an extent as would affect the element operation. Since the memory function body having a function of storing electric charges is disposed beside the gate electrode in the semiconductor storage element, the semiconductor storage element can serve as a nonvolatile semiconductor storage device.

Furthermore, since a semiconductor storage element having a spacing (offset region) between the gate electrode and the source/drain region with respect to the channel direction, and a semiconductor switching element having no such spacing, are compositely mounted on the identical substrate, it becomes possible to compositely mount a semiconductor switching element of high current-driving power and a semiconductor storage element of good memory effect.

In one embodiment, memory function bodies identical to the memory function bodies of the semiconductor storage element are provided on the opposite sides of the gate electrode of the semiconductor switching element.

Since the memory function bodies are formed beside the gate electrode not only in the semiconductor storage element but also in the semiconductor switching element, there is no large difference between the manufacturing processes for both elements, so that a semiconductor device in which semiconductor switching elements and semiconductor storage elements are compositely mounted can be easily fabricated with simple process and reduced in cost.

In one embodiment, the memory function bodies are side wall spacers provided on side faces of the gate electrode.

In the semiconductor device of this embodiment, since the side wall spacer can be formed by self-alignment process, a logic circuit or the like composed of the semiconductor switching elements and a nonvolatile memory composed of the semiconductor storage elements can be compositely mounted quite easily by using the self-alignment process.

In one embodiment, the memory function body comprises a charge retaining portion made of a material having a function of storing electric charges, and an anti-dissipation insulator having a function of preventing dissipation of stored charges, and the anti-dissipation insulator has a first insulator that is disposed between the charge retaining portion and the gate electrode and between the charge retaining portion and the semiconductor substrate.

In the semiconductor device of this embodiment, since the charge retaining portion is in contact with the gate electrode and the semiconductor substrate via the first insulator, leakage of stored charge from the charge retaining portion to the gate electrode and the semiconductor substrate can be suppressed. As a result, the charge retention characteristic becomes better and the long-term reliability is enhanced.

In one embodiment, the anti-dissipation insulator further has a second insulator which is associated with the first insulator to sandwich the charge retaining portion.

In this embodiment, since the charge retaining portion is sandwiched between the first insulator and the second insulator, electrons injected from, for example, the first insulator side into the charge retaining portion are prevented, by the second insulator, from rushing through the charge retaining portion. Thus, the injunction efficiency is enhanced, so that a nonvolatile memory of high-speed operation can be provided.

In one embodiment, a topmost position of the charge retaining portion is below a topmost position of the gate electrode.

According to the semiconductor device of this embodiment, the charge retaining portion is disposed limitedly in vicinities of the channel. Therefore, the electrons that are injected by write operation are limited to the vicinities of the channel, it becomes more easily achievable to remove the electrons by erase operation. Therefore, erase failures can be prevented. Also, since the area occupied by the charge retaining portion is limited, the electron density is increased on the assumption that the number of injected electrons is unchanged. Thus, a nonvolatile memory element capable of efficiently achieving electron write/erase operations and thus fast in write/erase speed can be formed.

In one embodiment, a topmost position of the charge retaining portion is below a topmost position of the first insulator.

According to the semiconductor device of this embodiment, the shortest distance in the case where the gate electrode and the charge retaining portion are connected to each other is elongated. Therefore, short-circuits between the gate electrode and the charge retaining portion can be suppressed in silicide or interconnection or other processes, so that a semiconductor device enabling a good yield can be formed.

In one embodiment, the charge retaining portion has a plurality of fine particles having a function of storing electric charge.

According to the semiconductor device of this embodiment, since the fine particles can be disposed along the vicinities of the channel, the electrons to be injected by write operation are limited to the vicinities of the channel, making it more easily achievable to remove the electrons by erase operation. Therefore, erase failures can be prevented. Alternatively, the fine particles may be formed into nano-dot like configuration, as an example. Therefore, the memory effect is greatly improved by the coulomb blockade effect. Thus, a nonvolatile memory element of quite high long-term reliability is formed.

In one embodiment, portions of the source/drain regions of the semiconductor switching element that extend under the gate electrode are lower in dopant concentration than other portions of the source/drain regions that are located outside the gate electrode and the memory function bodies.

According to the semiconductor device of this embodiment, the drain withstand voltage is improved. On the other hand, in this semiconductor storage element, since spacings are provided between the gate electrode and the source/drain regions with respect to the channel direction, hot carriers are generated efficiently, sufficiently fast write/erase speeds can be obtained. Thus, a semiconductor switching element of high reliability and a semiconductor storage element having sufficiently fast write/erase speeds can be realized at the same time.

Further, power supply voltages to be fed to the semiconductor switching element in the logic circuit area and the semiconductor storage element in the memory area may be set independently of each other. In this case, since a relatively high power supply voltage can be fed to the semiconductor storage element in the memory area, the write/erase speed can be relatively improved. Furthermore, since a relatively low power supply voltage can be fed to the semiconductor switching element in the logic circuit area, deteriorations of transistor characteristics due to breakdown of the gate insulator or the like can be suppressed, allowing the power consumption to be further reduced and allowing the composite mounting of those elements. Thus, it becomes possible to implement a semiconductor device having a logic circuit area of high reliability and a memory area of remarkably fast write/erase speeds both of which are easily compositely mounted on the same substrate.

Further, a static random access memory may be made up of a plurality of the semiconductor switching elements. In this case, the logic circuit part and the static random access memory are composed of a plurality of the semiconductor switching elements, while the nonvolatile memory part is composed of a plurality of the semiconductor storage elements. Therefore, a semiconductor device having a logic circuit part and a static random access memory, as well as a nonvolatile memory part, all of which are compositely mounted on the identical substrate, can be easily implemented. Furthermore, compositely mounting the static random access memory as a high-speed-operation-memory temporary storage memory makes it possible to achieve further functional improvement.

In one embodiment, in the semiconductor storage element, at least part of the charge retaining portion overlaps with part of the source/drain region.

In the semiconductor device of this embodiment, the current value in read operations of the semiconductor storage element is remarkably improved, as compared to the case where there is no such overlap. Thus, the read speed of the semiconductor storage element is remarkably improved.

In one embodiment, the charge retaining portion has a surface generally parallel to a surface of a gate insulator formed just under the gate electrode.

In the semiconductor device of this embodiment, the invertibility of the offset region can be effectively controlled by the amount of charges retained in the charge retaining portion, so that the memory effect can be increased. Also, even when the offset amount has varied, variations in the memory effect can be held relatively small, so that variations in the memory effect can be suppressed.

In one embodiment, the charge retaining portion has a surface generally parallel to a side face of the gate electrode.

In the semiconductor device of this embodiment, electric charges to be injected into the charge retaining portion in a rewrite operation are increased, so that the rewrite speed is increased.

In one embodiment, a film thickness of the first insulator is thinner than a film thickness of a gate insulator formed just under the gate electrode but not less than 0.8 nm.

In the semiconductor device of this embodiment, the injection of electric charge into the charge retaining portion becomes easier to achieve, so that voltages for write operations and erase operations can be lowered, or that write operations and erase operations can be made higher in speed. Also, when electric charges are retained in the charge retaining portion, the amount of electric charges to be induced to the channel forming region or the well region is increased, so that the memory effect can be increased. Further, since the film thickness of the first insulator is not less than 0.8 nm, unusual deteriorations of the retention characteristic are suppressed.

In one embodiment, a film thickness of the first insulator is thicker than a film thickness of a gate insulator formed just under the gate electrode but not more than 20 nm.

In the semiconductor device of this embodiment, the retention characteristic can be improved without worsening the short-channel effect of the memory. Also, since the film thickness of the first insulator is not more than 20 nm, decreases in the rewrite speed can be suppressed.

An IC card according to an embodiment of the present invention includes the semiconductor device of an embodiment of the present invention.

According to the IC card of an embodiment of the present invention, the same effects and advantages as in the semiconductor device of embodiments of the present invention are produced. For example, the IC card may include a semiconductor device in which a nonvolatile memory with its peripheral circuit part, logic circuit part, SRAM part, and the like are readily compositely mounted, and which has realized a cost reduction. Thus, an IC card that has realized a cost reduction can be provided.

Portable electronic equipment according to an embodiment of the present invention includes the semiconductor device of embodiments of the invention.

According to the portable electronic equipment of an embodiment of the present invention, the same effects and advantages as in the semiconductor device of embodiments of the present invention are produced. For example, a mobile phone may include a semiconductor device in which a nonvolatile memory with its peripheral circuit part, logic circuit part, SRAM part, and the like are readily compositely mounted, and which has realized a cost reduction. Thus, a mobile phone that has realized a cost reduction can be provided.

Also, a semiconductor device manufacturing method according to an embodiment of the present invention is a semiconductor device manufacturing method for forming a semiconductor storage element in a memory area set on a semiconductor substrate while concurrently forming a semiconductor switching element in a logic circuit area set on the semiconductor substrate, comprising:

forming gate electrodes on portions of a semiconductor substrate surface corresponding to the logic circuit area and the memory area, respectively, with a gate insulator disposed between each gate electrode and the semiconductor substrate surface;

in a state that a mask is provided so as to prevent a dopant from being introduced into the memory area, introducing the dopant into the logic circuit area with the gate electrode used as a mask to form a first doped region in the logic circuit area, the first doped region becoming part of a source/drain region;

forming a memory function body having a function of storing electric charges on a side face of the gate electrode in at least the memory area; and introducing a dopant of a conductivity type identical to that of the dopant used in the foregoing step into the logic circuit area and the memory area with the gate electrodes and the memory function body used as masks to form second doped regions in the logic circuit area and the memory area, the second doped regions becoming at least part of each of source/drain regions in the logic circuit area and the memory area.

According to the semiconductor device manufacturing method of an embodiment of the present invention, a semiconductor device in which semiconductor switching elements and semiconductor storage elements are compositely mounted can be easily fabricated with simple process, and reduced in cost. More specifically, a semiconductor switching element is formed in a logic circuit area set on a semiconductor substrate while a semiconductor storage element is concurrently formed in a memory area set on the semiconductor substrate. The resulting semiconductor switching element is one in which the first doped region is disposed on portions of the semiconductor substrate surface corresponding to both sides of the gate electrode, and in which there are no spacing between the gate electrode and the source/drain regions with respect to the channel direction. On the other hand, the resulting semiconductor storage element is one in which a spacing (offset region) is provided between the gate electrode and each of the source/drain regions with respect to the channel direction, where a memory function body having the function of storing electric charge is provided so as to cover the spacing at the semiconductor substrate surface. Further, since the semiconductor switching element having no offset region is relatively large in drive current and the semiconductor storage element having the offset region is relatively large in memory effect, it becomes easily achievable to compositely mount a logic circuit of large drive current and a nonvolatile memory of large memory effect.

In one embodiment, the step of forming a memory function includes:

depositing a material having a function of storing electric charges and a material having a function of preventing stored charges so as to cover with those materials a top surface and side surfaces of the gate electrode and portions of the semiconductor substrate surface disposed on opposite sides of the gate electrode; and selectively etching the materials to form a side wall spacer made of the materials on the side surfaces of the gate electrode.

In the semiconductor device manufacturing method of this one embodiment, the side wall spacer is formed in a self-alignment fashion by selective etchback. In this case, the semiconductor switching element having no offset region can be formed simply by using self-alignment process, and moreover the semiconductor storage element having the offset region as well can be formed simply by using self-alignment process. Accordingly, it becomes quite easily achievable to compositely mount the semiconductor storage elements of the nonvolatile memory and the semiconductor switching elements of the logic circuit part and the like.

The step for forming the memory function body may include:

depositing an insulating film so that in each of the logic circuit area and the memory area, the upper surface and side surfaces of the gate electrode as well as portions of the semiconductor substrate surface corresponding to opposite sides of the gate electrode are covered therewith;

depositing a material having a function of storing electric charge over the entire insulating film; and selectively etching the material so that a side wall spacer made of the insulating film and the material are formed on the side surfaces of the gate electrode in each of the logic circuit area and the memory area.

In this method, since the material having the function of retaining electric charges is in contact with the gate electrode and the semiconductor substrate via the insulating film (which, after being processed, is called an insulator), leakage of stored charges from this material to the gate electrode and the semiconductor substrate can be suppressed. As a result, the charge retention characteristic becomes better and the long-term reliability is enhanced.

Also, the step for forming the memory function body may include:

depositing a first insulating film so that in each of the logic circuit area and the memory area, the upper surface and side surfaces of the gate electrode as well as portions of the semiconductor substrate surface corresponding to opposite sides of the gate electrode are covered therewith;

depositing a material having a function of storing electric charge over the entire first insulating film;

depositing a second insulating film over the entire material; and selectively etching the second insulating film and the material so that a side wall spacer made of the first insulating film, the material, and the second insulating film are formed on the side surfaces of the gate electrode in each of the logic circuit area and the memory area.

In this method, since the material having the function of retaining electric charges is in contact with the gate electrode and the semiconductor substrate via the first insulating film (which, after being processed, is referred to as a first insulator), leakage of stored charges from this material to the gate electrode and the semiconductor substrate can be suppressed. As a result, the charge retention characteristic becomes better and the long-term reliability is enhanced. Further, since the material having the function of storing electric charges is sandwiched between the first insulating film and the second insulating film (after processing, referred to as a second insulator), it becomes possible to suppress short-circuits between the side wall spacer and the interconnection lines for connection to the source/drain regions as well as to reduce any parasitic capacitances. Thus, a semiconductor device capable of easy scale-down can be provided.

In one embodiment, dopant concentration of the first doped region is lower than dopant concentration of the second doped region.

According to this embodiment, because in the source/drain regions of the semiconductor switching element, the dopant concentration of the first doped region is lower than dopant concentration of the second doped region, the drain withstand voltage is improved. On the other hand, in this semiconductor storage element, since spacings are provided between the gate electrode and the source/drain regions with respect to the channel direction, hot carriers are generated efficiently, sufficiently fast write/erase speeds can be obtained. Thus, it is possible to concurrently make a semiconductor switching element of high reliability and a semiconductor storage element having sufficiently fast write/erase speeds.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIGS. 3A-3D are schematic sectional views showing the manufacturing process of a semiconductor storage device according to a first embodiment of the invention;

FIG. 20 is a schematic view showing the structure of an example of the semiconductor storage element according to the first embodiment of the invention;

FIG. 21 is a schematic view showing the structure of another example of the semiconductor storage element according to the first embodiment of the invention;

DETAILED DESCRIPTION OF THE PREFERRED EMBODIMENTS

Figure 1:
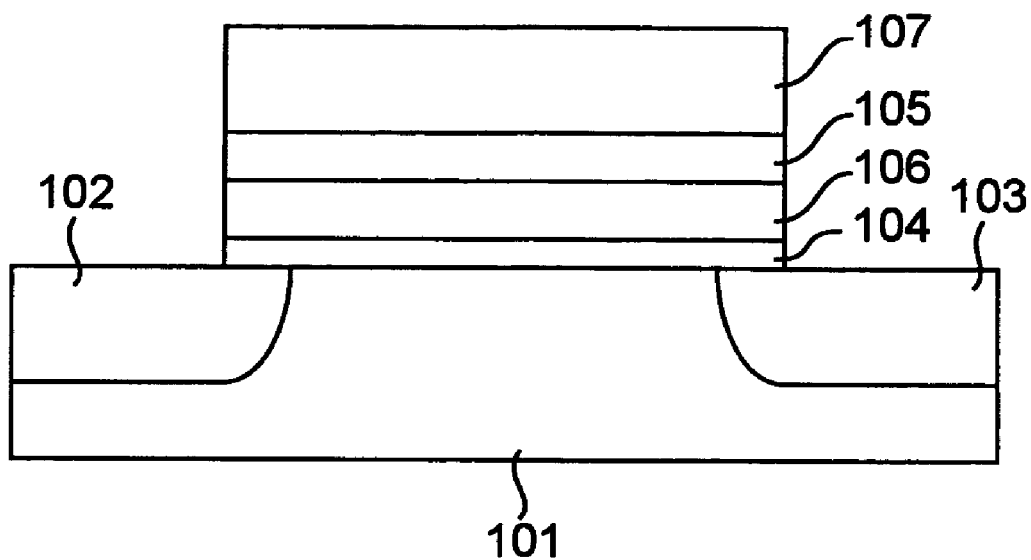
FIG. 1 is a schematic sectional view showing the structure of a conventional non-volatile memory element.

Hereinbelow, the present invention is described in detail by embodiments thereof illustrated in the accompanying drawings.

First Embodiment

FIG. 20 shows a planar layout of a memory unit 200 which is an embodiment of the semiconductor device of the invention. In this memory unit 200, a logic circuit area 202 provided with semiconductor switching elements and a memory area 201 provided with semiconductor storage elements are arranged on one semiconductor substrate 1. In the memory area 201 is formed a memory cell array in which semiconductor storage elements, details of which will be described later, are disposed in an array configuration. In the logic circuit area 202 (surrounded by broken line) are formed peripheral circuits that can be made up by normal MOSFETs (metal-oxide-semiconductor field-effect transistors), such as a decoder 203, a write/erase circuit 204, a read circuit 205, an analog circuit 206, a control circuit 207 and various types of I/O circuits 208.

Further, in order that a storage device 300 of an information processing system for personal computers, portable telephones and the like is made up with one chip as shown in FIG. 21, a MPU (Micro-Processing Unit) 301, a cache (SRAM (static RAM)) 302, a logic circuit 303, an analog circuit 304 and the like, which should be added to the logic circuit area of the memory unit 200, need to be disposed on the same semiconductor substrate 1.

Conventionally, composite mounting of the memory area 201 and the logic circuit area 202 has caused the manufacturing cost to be largely increased, compared with standard CMOS formation. As will be apparent from the following description, the increase in manufacturing cost can be suppressed by the present invention.

The semiconductor device of the present invention can be used for battery-driven portable electronic equipment, in particular, personal digital assistants. The portable electronic equipment can be exemplified by personal digital assistants, portable telephones, game equipment, and the like.

FIGS. 2A-2D illustrate a cross section taken along one channel direction in a plurality of semiconductor storage elements 32 constituting the memory area 201. The lateral direction in FIGS. 2A-2D corresponds to the channel direction.

In this semiconductor storage element 32, as shown in FIGS. 2A-2D, a gate electrode 3 is provided on a semiconductor substrate 1 with a gate insulator 2 sandwiched therebetween. Two source/drain (diffusion) regions 13, 13 are formed at a semiconductor substrate surface 1a on both sides of the gate electrode 3. These source/drain regions 13 are offset from respective end portions 3e of the gate electrode 3. That is, spaces (referred to as "offset areas") 20 are provided between the gate electrode 3 and the source/drain regions 13 along the channel direction. On both sides of a gate stack 8 composed of the gate insulator 2 and the gate electrode 3, memory function bodies 25 having a function of storing electric charges are formed in such a manner as to cover the spaces 20 and overlap therewith, respectively.

Herein, the memory function body and designations of its individual parts are defined as follows.

Figure 2A:
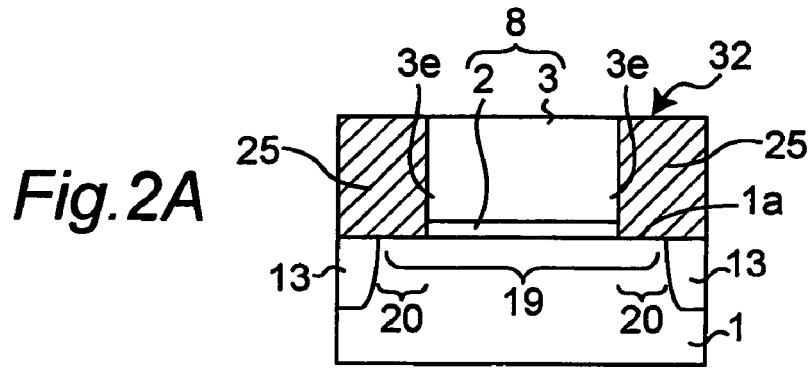
FIGS. 2A-2D are schematic sectional views of semiconductor storage elements according to the present invention.
Figure 2B:
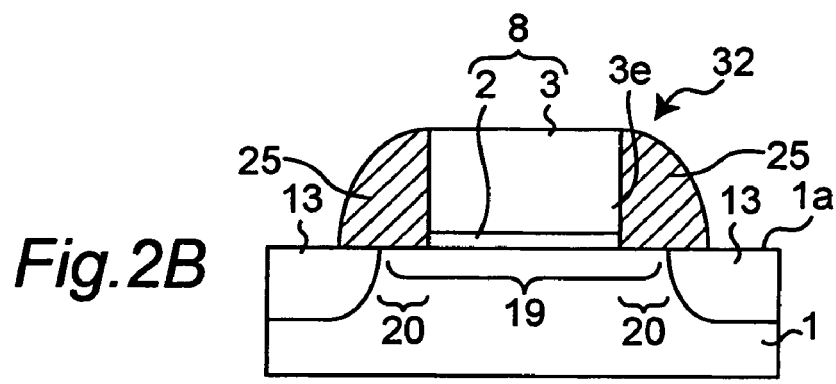
Figure 2C:
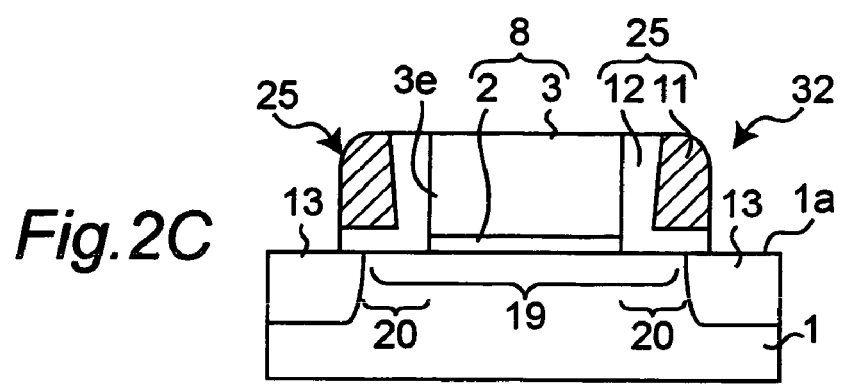
Figure 2D:
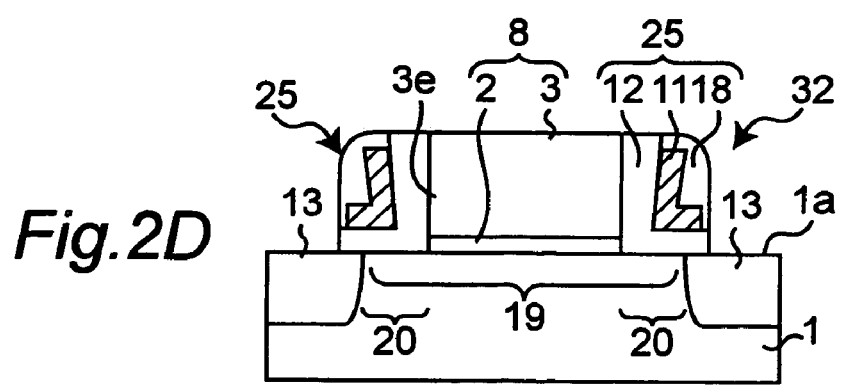

That is, as shown in FIGS. 2A-2D, the memory function bodies 25 refer to regions formed beside the gate electrode 3 and having a function of storing electric charges. In this case, the memory-function body 25 is made of a charge retaining portion and an anti-dissipation insulator. For example, as shown in FIG. 2C, the memory function body 25 may be composed of a charge retaining portion 11 which is an area capable of storing electric charges, and a first insulator 12 which is capable of preventing dissipation of electric charge. Also, as shown in FIG. 2D, the memory function body 25 may be composed of a charge retaining portion 11 which is a portion capable of retaining electric charge, and a first insulator 12 and a second insulator 18 which are capable of preventing dissipation of electric charge. Hereinbelow, the first insulator 12 or the first insulator 12 and the second insulator 18 are referred to as an anti-dissipation insulator.

It is noted that the first insulator 12 and the second insulator 18 are merely divided for convenience's sake, and actually do not necessarily need any particular boundary therebetween. That is, those insulators, when formed of the same material, practically cannot be distinguished from each other. Nevertheless, even in such a case, needless to say, the effectiveness of the present invention can be produced without any degradation.

Also, as shown in FIGS. 2C and 2D, the first insulator 12 is, in some cases, not uniform in film thickness but thicker in an upper portion than in a lower portion, and vice versa. In such cases, of course, the effectiveness of the invention can also be fulfilled without degradations. In the case where the upper portion is thicker than the lower portion, excessive charge injection from the gate electrode in the upper portion is suppressed as compared to cases where the film thickness is uniform, and moreover the retained charge has a greater influence on the offset areas.

Further, in the semiconductor storage element 32, since the source/drain regions 13 are offset from the gate electrode 3, the degree of invertibility of the offset areas under the memory function bodies 25 with the voltage applied to the gate electrode 3 can be largely changed by the amount of charges stored in the memory function bodies 25, thus making it possible to increase the memory effect. Further, as compared with MOSFETs of common structure, the short-channel effect can be suppressed, thus making it possible to scale down the gate length. The structural suitability for the short-channel effect suppression due to the above-mentioned reason makes it allowable to adopt a gate insulator film having a larger film thickness, as compared with that of logic transistors having no offset arrangement, thus making it possible to improve the reliability.

The memory function bodies 25 of the semiconductor storage element 32 are formed of a material independent of the gate insulator 2. Therefore, the memory function served by the memory function bodies 25 and the transistor operation function served by the gate insulator 2 are implemented independently of each other. Also, for the same reason, a material suitable for the memory function can be selected to form the memory function bodies 25.

The semiconductor storage element 32 stores two- or more-value information in one memory function body 25, thereby functioning as a semiconductor storage element 32 that stores four- or more-value information. Also, by virtue of variable-resistance effect of the memory function bodies 25, the semiconductor storage element 32 functions also as a memory cell having the functions of a selector transistor and a memory transistor at the same time. However, this semiconductor storage element 32 does not necessarily need to be made to store four- or more-value information and function as such, but may be made to store two-value information.

Here is shown an example of the principle of the write/erase and read operations for implementation of 2-bit storage per transistor. Below described is a case where the memory elements are of the N-channel type. This means that when the memory elements are of the P-channel type, reversing the sign of voltage allows the same principle to be applicable. It is noted that the ground voltage may be given to nodes for which the applied voltage is not specified (source, drain, gate, substrate).

For write operation to this semiconductor storage element 32, a positive voltage is applied to the gate while a positive voltage of a level similar to or higher than that for the gate is applied to the drain. In this case, charges (electrons) supplied from the source are accelerated at proximities to the drain end, becoming hot electrons and being injected into the drain-side memory function body 25. Upon this occurrence, electrons are not injected into the memory function body 25 present on the source side. In this way, the write operation into a memory function body 25 on one particular side can be achieved. Replacement of source and drain with each other allows the 2-bit write operation to be achieved with ease.

To erase the information written into the semiconductor storage element 32, hot hole injection is utilized. That is, a positive voltage may be applied to the diffusion layer region (source/drain) on the side on which the memory function body 25 to be erased is present, while a negative voltage may be applied to the gate. When this is done, positive holes are generated through interband tunneling at the PN junction between the semiconductor substrate 1 and the diffusion layer region to which the positive voltage is given, so that the holes are attracted to the gate having a negative voltage so as to be injected into the memory function body 25 to be erased. In this way, information on one particular side can be erased. Information written in the opposite-side memory function body 25 can be erased by applying a positive voltage to the opposite-side memory function body 25.

Next, for read of information written in this semiconductor storage element 32, the diffusion region on one side on which the memory function body 25 to be read is present is assumed as the source, while the opposite-side diffusion region is assumed as the drain. That is, a positive voltage may be applied to the gate, while a positive voltage of a level similar to or higher than that for the gate may be given to the drain (that has been assumed as the source for the write operation). However, the voltage in this operation needs to be set small enough to inhibit a write operation. The drain current changes depending on the amount of charges stored in the memory function body 25, by which stored information can be detected. Further, interchange of the source and the drain with each other allows information written in the opposite-side memory function body 25 to be read out.

The above method for write/erase and read operations is an example for a case in which nitride film is used in the memory function bodies 25, and other methods may also be used. Furthermore, even in cases where other materials are used, the above or other write and erase methods may also be used.

Further, since the memory function bodies 25 are placed not under the gate electrode 3 but on both sides of the gate electrode 3, there is no need for making the gate insulator 2 function as the memory function bodies 25, thus allowing the gate insulator 2 to be simply used only for the function as a gate insulator independent of the memory function bodies 25. Thus, it becomes practicable to make designs complying with the LSI scaling law. As a result, there is no need for inserting the floating gate between the channel and the control gate, as is done with the flash memory, and moreover there is no need for adopting an ONO film having a memory function as the gate insulator 2. This makes it possible to adopt a gate insulator compatible with the scale-down, while the electric field of the gate electrode 3 comes to exert a stronger influence on the channel, so that a semiconductor storage element 32 having a memory function and being strong against the short-channel effect can be realized. Therefore, the degree of integration can be improved with more scale-down implemented, and less expensive nonvolatile memory elements can be provided. Further, also for the gate insulator 2 in concurrently formed MOSFETs of the logic circuit part, it becomes possible to adopt a gate insulator appropriate for the scale-down as in the semiconductor storage element 32, so that MOSFETs strong to the short-channel effect are formed at the same time. Thus, high-performance nonvolatile memory elements and MOSFETs of the logic circuit part or the like can be formed with simple process using self alignment.

As shown above, according to this semiconductor storage element 32, while 2-bit storage per transistor is implemented, the short-channel effect can be greatly suppressed, making the scale-down achievable. Also, high-speed operation and low power consumption can be achieved. Further, when charges are retained in the memory function bodies 25, since part of a channel forming region 19 is strongly affected by the charge, the drain current value changes. As a result, nonvolatile memory elements in which presence of electric charges is distinguishable from absence of electric charges are formed.

It is noted that alternatively, the semiconductor storage element 32 may be formed on a second conductivity type well region formed within the first conductivity type semiconductor substrate.

Further, only one word line that is necessary for one memory cell and that is connected to the gate electrode 3 or serves as the gate electrode 3 itself will do for the memory cell to fulfill the functions of both a conventional selector transistor and a memory cell transistor. Therefore, a higher degree of integration of the semiconductor device becomes achievable.

Further, detecting the presence/absence of electric charges in the memory function bodies 25 depending on a change in the amount of current flowing from one of the source/drain regions 13 to the other of the source/drain regions 13 makes it possible to distinguish a slight charge difference in the memory function bodies 25 as a large current difference.

Further, the resistance value of the variable-resistance portion positioned under the memory function bodies 25 change depending on the presence or absence of electric charge in the memory function bodies 25. Detecting the presence or absence of electric charges in the memory function bodies 25 depending on a change in the amount of current flowing from one of the source/drain regions 13 to the other of the source/drain regions 13 makes it possible to detect a slight charge difference in the memory function bodies 25 as a large current difference.

Further, with respect to one memory cell, the memory cell is structured such that the single gate electrode 3 is sandwiched between the two memory function bodies 25, 25 formed on its both sides, which makes it possible to minimize the number of electrodes necessary for the detection method in which the presence or absence of electric charges in the memory function bodies 25 is detected depending on a change in the amount of current flowing from one of the source/drain regions 13 to the other of the source/drain regions 13, i.e., a detection method that allows a slight charge difference to be discriminated as a large current difference. Therefore, the area occupied by the memory cells can be reduced.

It is preferable that the semiconductor storage element constituting the semiconductor device of the present invention is formed on a semiconductor substrate, or in a well region formed in a semiconductor substrate and having the same conductivity type as the channel forming region in the semiconductor substrate.

The semiconductor substrate is not limited to particular ones as far as it is applicable to semiconductor apparatuses, and it is possible to use various substrates such as substrates made from elemental semiconductors including silicon and germanium, substrates made from compound semiconductors including SiGe, GaAs, InGaAs, ZnSe, and GaN, SOI (Silicon on Insulator) substrates and multilayer SOI substrates, and substrates having a semiconductor layer on a glass or plastic substrate. Among these, a silicon substrate or an SOI substrate having a silicon surface layer is preferable. The semiconductor substrate or the semiconductor layer may be either of a single crystal (e.g., single crystal obtained by epitaxial growth), polycrystalline, or amorphous, though a current amount flowing inside will be slightly different among them.

In the semiconductor substrate or the semiconductor layer, it is preferable that device isolation regions are formed, and it is more preferable to combine elements such as transistors, capacitors and resistors, a circuit composed thereof, a semiconductor device, and an inter-layer insulating film or films to form into a single or a multilayer structure. It is noted that the device isolation region may be formed by any of various device isolation films including a LOCOS (local oxidation of silicon) film, a trench oxide film, and an STI (Shallow Trench Isolation) film. The semiconductor substrate may be either of a P type or an N type conductivity type, and it is preferable that at least one first conductivity type (P type or N type) well region is formed in the semiconductor substrate. Acceptable impurity concentrations of the semiconductor substrate and the well region are those within the known range in the art. It is noted that in the case of using an SOI substrate as the semiconductor substrate, a well region may be formed in the surface semiconductor layer, and also a body region may be provided under the channel forming region.

Examples of the gate insulating film are not particularly limited and include those for use in typical semiconductor apparatuses, such as insulating films including silicon oxide films and silicon nitride films; and high-dielectric films including aluminum oxide films, titanium oxide films, tantalum oxide films, hafnium oxide films, in the form of single-layer films or multi-layer films. Among these, the silicon oxide film is preferable. An appropriate thickness of the gate insulating film is, for example, approx. 1 to 20 nm in equivalent insulator thickness, preferably 1 to 6 nm. The gate insulating film may be only formed right under the gate electrode, or may be formed to be larger (in width) than the gate electrode.

The gate electrode or electrode is formed on the gate insulation film normally in a shape for use in a semiconductor device or a shape that has a concave portion in a lower end portion. Herein, the "single gate electrode" is defined as a gate electrode consisting of a monolayer or multilayer conductive film and formed into a single inseparable piece. The gate electrode may have a side wall insulation film on each side surface. The gate electrode is normally not specifically limited so long as it is used for a semiconductor device, and there can be enumerated conductive films of: polysilicon; metals including copper and aluminum; high-melting metals including tungsten, titanium, and tantalum; and silicides of high-melting metals, in the form of a single-layer or a multi-layer. The gate electrode should properly be formed with a film thickness of, for example, about 50 to 400 nm. It is to be noted that a channel forming region is formed under the gate electrode.

The memory function body has at least a film or a region having a function of retaining electric charges, a function of storing and retaining charges, a function of trapping charges or a function of retaining a charge polarized state. Materials implementing these functions include: silicon nitride; silicon; silicate glass including impurities such as phosphorus or boron; silicon carbide; alumina; high-dielectric substances such as hafnium oxide, zirconium oxide, or tantalum oxide; zinc oxide; and metals. The memory function body may be formed into single-layer or multi-layer structure of: for example, an insulating film containing a silicon nitride film; an insulating film incorporating a conductive film or a semiconductor layer inside; and an insulating film containing one or more conductor dots or semiconductor dots. Among these, the silicon nitride is preferable because it can achieve a large hysteresis property by the presence of a number of levels for trapping electric charges, and has good holding characteristics in that the electric-charge holding time is long and that there hardly occurs leakage of electric charges caused by generation of leakage paths, and further because it is a material normally used in LSI process.

Use of an insulating film containing inside an insulating film having a charge holding function such as a silicon nitride film enables increase of reliability relating to memory holding. Since the silicon nitride film is an insulator, electric charges of the entire silicon nitride film will not be immediately lost even if part of the electric charges is leaked. Further, in the case of arraying a plurality of storage devices, even if the distance between the storage devices is shortened and adjacent memory function bodies come into contact with each other, information stored in each memory function body is not lost unlike the case where the memory function body is made from a conductor. Also, it becomes possible to dispose a contact plug closer to the memory function body, or in some cases it becomes possible to dispose the contact plug so as to overlap with the memory function body, which facilitates miniaturization of the storage devices.

For further increase of the reliability relating to the memory holding, the insulator having a function of holding electric charges is not necessarily needed to be in the film shape, and insulators having the function of holding an electric charge are preferably present in an insulating film in a discrete manner. More specifically, it is preferable that an insulator is dispersed like dots over a material having difficulty in holding electric charges, such as silicon oxide.

Also, use of an insulator film containing inside a conductive film or a semiconductor layer as a memory function body enables free control of quantity of electric charges injected into the conductor or the semiconductor, thereby bringing about an effect of facilitating achieving multi level cell.

Further, using an insulator film containing one or more conductor or semiconductor dots as a memory function body facilitates execution of write and erase due to direct tunneling of electric charges, thereby bringing about an effect of reduced power consumption.

Moreover, it is acceptable to use, as a memory zirconate titanate) and PLZT (lead lanthanum zirconate titanate) whose polarization direction is changed by an electric field. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase is achievable.

It is preferable that the memory function body further contains a region that obstructs escape of electric charges or a film having a function of obstructing escape of electric charges. Materials fulfilling the function of obstructing escape of electric charges include a silicon oxide.

The charge holding portion contained in the memory function body is formed on opposite sides of the gate electrode directly or via an insulating film, and it is disposed on the semiconductor substrate (a well region, a body region, or a source/drain region or a diffusion layer region) directly or via the gate insulating film or the insulating film. The charge holding portions on both sides of the gate electrode are, in an embodiment of the present invention, preferably formed so as to cover all or part of side walls of the gate electrode directly or via the insulating film. In an application where the gate electrode has a recess portion on the lower edge side, the charge holding portion may be formed so as to fill the entire recess portion or part of the recess portion directly or through the insulating film.

Preferably, in an embodiment of the present invention, the gate electrode is formed only on the side wall of the memory function body or formed such that the upper portion of the memory function body is not covered. In such disposition, it becomes possible to dispose a contact plug closer to the gate electrode, which facilitates miniaturization of the semiconductor storage elements. Also, the semiconductor storage elements having such simple disposition are easily manufactured, resulting in an increased yield.

In the case of using a conductive film as the charge holding portion, the charge holding portion is preferably disposed with interposition of an insulating film so that the charge holding film is not brought into direct contact with a semiconductor substrate (a well region, a body region, or a source/drain region or a diffusion layer region) or the gate electrode. This is implemented by, for example, a multi-layer structure composed of a conductive film and an insulating film, a structure of dispersing a conductive film like dots in an insulating film, and a structure of disposing a conductive film within part of a side-wall insulating film formed on the side wall of the gate.

The source/drain regions are disposed on the side of the memory function bodies opposed from the gate electrode as diffusion regions having a conductivity type opposite to that of the semiconductor substrate or of the well region. In the portion where the source/drain region is joined to the semiconductor substrate or the well region, impurity concentration is preferably sharp. This is because the sharp impurity concentration efficiently generates hot electrons and hot holes with low voltages, which enables high-speed operations with lower voltages. The junction depth of the source/drain region is not particularly limited and so it is adjustable where necessary, according to performance and the like of a memory device to be manufactured. It is noted that if an SOI substrate is used as the semiconductor substrate, the junction depth of the source/drain region may be smaller than the film thickness of a surface semiconductor layer, though preferably the junction depth is almost equal to the film thickness of the surface semiconductor layer.

The source/drain region may be disposed so as to be overlapped with the edge of the gate electrode, or to meet the edge of the gate electrode, or to be offset from the edge of the gate electrode. Particularly, it is preferable that the source/drain region is offset relative to the edge of the gate electrode. This is because in this case, when voltage is applied to the gate electrode, easiness of inversion of the offset region under the charge holding portion is largely changed by an electric charge amount stored in the memory function body, resulting in increased memory effect and reduced short channel effect. It is noted, however, that too much offset extremely reduces drive current between the source and the drain. Therefore, it is preferable that an offset amount, that is a distance from one edge of the gate electrode to the source or drain region closer thereto in the gate length direction, is shorter than the thickness of the charge holding portion in the gate length direction. should be noted that, in this embodiment, at least part of the charge holding portion in the memory function body overlaps with the source/drain region serving as a diffusion layer region. This is because the nature of semiconductor storage elements constituting the semiconductor device of the present invention is to rewrite memory with an electric field crossing the memory function body by voltage difference between the gate electrode present only on the side wall portion of the memory function body and the source/drain region.

Part of the source/drain region may be extended to the position higher than the surface of the channel forming region, that is, the lower face of the gate insulating film. In this case, it is appropriate that a conductive film is laid on a source/drain region formed in the semiconductor substrate in an integrated manner with the source/drain region. Examples of the conductive film include semiconductors such as polysilicon and amorphous silicon, silicide, and the above described metals and high-melting metals. Among these, the polysilicon is preferable. Since the polysilicon is extremely larger in impurity diffusion speed than the semiconductor substrate, it is easy to shallow the junction depth of the source/drain region in the semiconductor substrate, and it is easy to control short channel effect. In this case, it is preferable that the source/drain region is disposed such that at least part of the charge holding film is sandwiched between part of the source/drain region and the gate electrode.

The semiconductor storage element of the present invention can be formed by the ordinary semiconductor process according to a method similar to the method of forming a side wall spacer of a single layer or laminate structure on the side wall of the gate electrode or word line. In concrete, there can be enumerated: a method comprising forming a gate electrode or a word line, thereafter forming a single layer film or multilayer film including a charge retaining portion, such as a charge retaining portion, a charge retaining portion/insulation film, an insulation film/charge retaining portion, and an insulation film/charge retaining portion/ insulation film, and leaving the film or films in a side wall spacer shape by etching back under appropriate conditions; a method comprising forming an insulation film or a charge retaining portion, leaving the film in a side wall spacer shape by etching back under appropriate conditions, further forming a charge retaining portion or insulation film and leaving the film in a side wall spacer shape by etching back under appropriate conditions; a method comprising coating or depositing, on a semiconductor wafer including a gate electrode, an insulation film material in which a particulate charge retaining material is distributed, and leaving the insulation film material in a side wall spacer shape by etching back under appropriate conditions; a method comprising forming a gate electrode, thereafter forming the single layer film or the multilayer film and carrying out patterning by using a mask, and so on. Moreover, there can be enumerated a method comprising forming a charge retaining portion, a charge retaining portion/insulation film, an insulation film/charge retaining portion, or an insulation film/charge retaining portion/insulation film before forming a gate electrode or an electrode, forming an opening through the film or films in a region that becomes a channel forming region, forming a gate electrode material film on the entire upper surface of the wafer and patterning this gate electrode material film in a shape, which is larger than the opening in size and encompasses the opening.

When a memory cell array is constructed by arranging the semiconductor storage elements of the present invention, a best mode of the semiconductor storage elements is to satisfy, for example, the following required conditions:

(i) The function of a word line is possessed by the integrated body of the gate electrodes of a plurality of semiconductor storage elements;

(ii) The memory function body is formed on each of opposite sides of the word line;

(iii) A material that retains electric charges in the memory function body is an insulator, and in particular, a silicon nitride film;

(iv) The memory function bodies are constructed of an ONO (Oxide Nitride Oxide) film, and the silicon nitride film has a surface roughly parallel to the surface of the gate insulation film;

(v) The silicon nitride film in each memory function body is separated from the word line and the channel forming region by the silicon oxide film;

(vi) A silicon nitride film in each memory function body overlaps with the corresponding diffusion region;

(vii) The thickness of the insulation film, which separates the silicon nitride film that has a surface roughly parallel to the surface of the gate insulation film from the channel forming region or the semiconductor layer differs from the thickness of the gate insulation film;

(viii) Write and erase operations of one semiconductor storage element are executed by a single word line;

(ix) There is no electrode (word line), on each memory function body, which has a function to assist the write and erase operations; and (x) A portion put in contact with the diffusion region right under each memory function body has a region where the impurity concentration of the conductivity type opposite to the conductivity type of the diffusion region is high.

The best mode is a mode in which all of these requirements are satisfied, but it is not necessary to satisfy all requirements.

When some of the above requirements are satisfied, there are most preferable combinations of requirements. For example, a most preferable combination resides in that (iii) a material that retains electric charges in the memory function body is an insulator, and in particular, a silicon nitride film; (ix) there is no electrode (word line), on each memory function body, which has a function to assist the write and erase operations; and (vi) an insulator (silicon nitride film) in each memory function body overlaps with the corresponding diffusion region. According to the finding by the inventors, when an insulator retains electric charges in the memory function body and there is no electrode, on each memory function body, which has a function to assist the write and erase operations, write operations are well performed only if the insulator (silicon nitride film) in each memory function body overlaps with the corresponding diffusion region. That is, when requirements (iii) and (ix) are satisfied, it is particularly preferred that requirement (vi) be satisfied. On the other hand, if a conductor retains electric charges in the memory function body or if there is an electrode, on each memory function body, which has a function to assist the write and erase operations, the write operations are effected even if the insulator in each memory function body does not overlap with the corresponding diffusion region. However, if an insulator retains electric charges in the memory function body or if there is no electrode, on each memory function body, which has a function to assist the write and erase operations, the following great advantages are obtained. That is, it is possible to place a contact plug closer to the memory function body. Or, even if the semiconductor storage elements are put close to each other in distance, the plurality of memory function bodies do not interfere with one another, and the storage information can be retained. Therefore, the miniaturization of the semiconductor storage elements is facilitated. Furthermore, since the element structure is simple, the number of fabrication process steps is reduced, and the yield can be improved. Also, combination with the transistors that constitute a logic circuit and an analog circuit can be facilitated. Furthermore, we have ascertained that the write and erase operations can be executed at a low voltage of not higher than 5 V. This is why satisfying requirements (iii), (ix) and (vi) is particularly preferable.

The semiconductor device of the present invention in which semiconductor storage elements are combined with logic elements is applicable to battery-driven portable electronic equipment, in particular personal digital assistants. Examples of the portable electronic equipment are mobile phones and game machines, in addition to personal digital assistants.

The first embodiment describes the N-channel devices. However, the devices may be of P channel, in which case the conductivity types of the impurities should be reversed.

Moreover, in the drawings, the same reference numerals are given to the portions where the same material and substances are used and do not necessarily indicate the same shapes.

Moreover, it is to be noted that the drawings are schematic, and the dimensional relations between thickness and plane, ratios of thickness and size between layers and portions and so on are different from those of the actual ones. Therefore, the concrete dimensions of thickness and size should be determined in consideration of the following description. Moreover, there are, of course, included the portions whose mutual dimensional relations and ratios are different between the figures.

Moreover, the thickness and the size of the layers and portions described in the present patent specification are the dimensions of the final shapes in the stage in which the formation of the semiconductor device is completed unless specifically described. Therefore, it is to be noted that the dimensions of the final shapes somewhat change depending on the thermal history and so on of the subsequent processes in comparison with the dimensions immediately after the formation of the films, the impurity regions and so on.

Next, FIGS. 3A-3D show a procedure for compositely mounting or forming, on one semiconductor substrate (chip), a logic circuit area 4 having a plurality of semiconductor switching elements 31 which are MOSFETs of normal structure, and a memory area 5 having a plurality of the above-described semiconductor storage elements 32. In FIGS. 3A-3D, the left side half depicts a region corresponding to one MOSFET of normal structure in the logic circuit area 4 while the right side half depicts a region corresponding to one nonvolatile memory element in the memory area 5 (The same is true with embodiments described later and shown FIGS. 4A-4F, FIGS. 5A-5D, FIGS. 17A-17D and FIGS. 18A-18D.). The logic circuit area 4 generally refers to an area including memory peripheral circuits, logic circuits, an SRAM, etc.

In each semiconductor storage element 32 of the memory area 5, since memory function bodies 25 are provided on side faces of a gate stack 8, the composite mounting becomes very simple. In more detail, it is shown below that the logic circuit area 4 and the memory area 5 can be fabricated automatically on one substrate by adding a photolithography step subsequently to the formation of the gate electrode 3 to thereby provide one region where LDD (Lightly Doped Drain) diffusion regions are formed and another region where not.

First, as shown in FIG. 3A, a gate insulator 2 made of an about 1 nm to 6 nm thick silicon nitride film, and an about 50 nm to 400 nm thick material film for formation of a gate electrode 3, are formed on a semiconductor substrate 1, and these films are patterned into a desired configuration, by which a gate stack 8 is formed.

It is noted that the material film for formation of the gate electrode 3 is exemplified by polysilicon, a multilayer film of polysilicon and high-melting-metal silicide, or a multilayer film of polysilicon and metal. Materials of the gate insulator 2 and the gate electrode 3, as described above, may be ones which are used in logic processes complying with the days' scaling law, and are not limited to the aforementioned ones.

Next, as shown in FIG. 3B, photoresist coating is performed so that the memory area 5 is covered with the photoresist 7, and patterning is performed so that a resist opening is provided at a site in the logic circuit area 4 where the semiconductor switching element 31 is to be formed (A left side half of FIG. 3B corresponds to a resist opening.). Then, with the photoresist 7 and the gate stack 8 used as a mask, dopants are implanted, by which LDD regions 6 are formed at a semiconductor substrate surface in positions corresponding to both sides of the gate stack 8 in the logic circuit area 4. The LDD regions 6 have been formed in the logic circuit area 4 where a transistor of normal structure is to be formed, while no LDD region 6 has been formed in the memory area 5.

Subsequently, as shown in FIG. 3C, on the resultant semiconductor substrate 1 and an exposed surface of the gate stack 8, an about 20 nm to 100 nm thick silicon nitride film is formed and etched back by an anisotropic etching, by which memory function bodies 25 suited for storage are formed as side walls along the side surfaces of the gate electrode 3. More preferably, instead of a single layer film made of a silicon nitride film, an about 1 to 20 nm silicon oxide film and an about 2 to 100 nm silicon nitride film are deposited one after the other and etched back by anisotropic etching so that memory function bodies 25 best suited for storage are formed in side wall configuration on the side surfaces of the gate electrode.

In this example, a silicon nitride film is used as the material of the memory function body 25. However, as described before, the memory function body 25 has only to be formed from a substance having a function of storing or trapping electric charges or retaining a charge polarized state. For example, the memory function body 25 may be formed by a single-layer or multi-layer structure of an insulating substance including silicon nitride, an insulating substance internally containing electrical conductor or semiconductor, an insulating substance containing one or more electrical conductor or semiconductor dots, and the like. Besides, ferroelectric substances such as PZT and PLZT in which the direction of polarization is changed by the electric field may also be used as one mode of the memory function body 25.

However, when the material of the memory function body 25 is given by electrical conductor or semiconductor, or a material containing a substance having electrical conductivity such as an insulator internally containing electrical conductor or semiconductor, it is necessary that, after formation of the memory function body 25 surrounding outer peripheral surfaces of the gate electrode 3, the memory function body 25 should be made into mutually electrically insulated memory function bodies 25 on the right and left of the gate electrode 3.

Figure 19A:
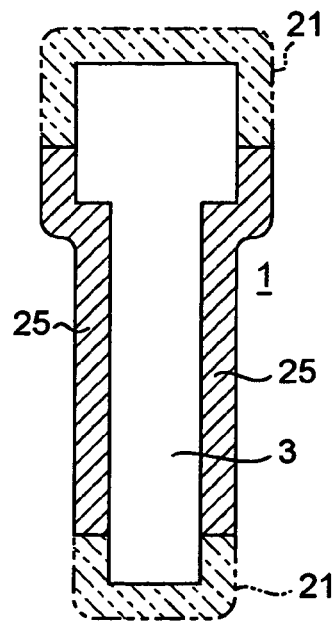
FIGS. 19A-19E are schematic sectional views showing part of the manufacturing process steps of a semiconductor storage device according to the invention.

Therefore, as shown in FIG. 19A, for formation of electrically insulated right and left memory function bodies 25, 25, portions (removal regions 21) of the annular memory function body 25 are removed by etching. These removal regions 21 are shown as phantom-line hatched portions in front and rear positions of the annular memory function body 25. A removal method therefor is to pattern the photoresist by using a known photolithography process so that the memory function body 25 except the removal regions is covered therewith. Thereafter, by performing anisotropic etching, exposed portions (removal regions 21) of the memory function body 25 are removed. This etching may appropriately be performed under such conditions that allow the memory function body 25 to be selectively etched and that provide a large etching selection ratio of the memory function body to the gate electrode 3 and the semiconductor substrate 1. It is noted that the removal regions 21 are preferably positioned on the device isolation region.

Thereafter, as shown in FIG. 3D, with the gate electrode 3 and the memory function body 25 used as a mask, dopants are ion-implanted, by which source/drain regions 13 are formed at semiconductor substrate surface portions corresponding to both sides of an unit of the gate electrode 3 and the memory function bodies 25.

With such a method as described above, the semiconductor switching elements 31 and the semiconductor storage elements 32 can be formed concurrently on one substrate 1.

As can be understood from the above procedure, the procedure for forming the semiconductor storage element 32 is highly compatible with the formation process of MOSFETs of normal structure. The structure of the semiconductor storage element 32 is close to that of a known general MOSFET. Such a general MOSFET can be changed into the semiconductor storage element 32 only by not forming the LDD region 6 and with the use of, for example, a material having a function as the memory function body 25 for the side wall spacer of known general MOSFETs. Even though the side wall spacers of the normal-structure MOSFET constituting the memory peripheral circuit part, the logic circuit part, the SRAM part and the like having the function as the memory function body 25, the transistor performance thereof is not impaired as far as the side wall spacers have an appropriate width and are operated on a voltage that does not cause a rewrite operation. Accordingly, identical side wall spacers can be used for both the semiconductor switching element 31 constituted of a MOSFET of normal structure and the semiconductor storage element 32. Further, in order to form the semiconductor storage elements 32 together with the semiconductor switching elements 31 formed of normal-structure MOSFETs and constituting the memory peripheral circuit area, the logic circuit area, the SRAM area and the like, there is a need for forming an LDD structure in the memory peripheral circuit area, the logic circuit area, the SRAM area and the like. For the formation of the LDD structure, dopant implantation may be done after the gate electrode 3 has been formed and before the material for forming the memory function body 25 is deposited. Therefore, the semiconductor storage elements (nonvolatile memory elements) 32 and the normal-structure MOSFETs constituting the memory peripheral circuit part, the logic circuit part, the SRAM part and the like can easily be compositely formed only by masking the memory area 5 with the photoresist 7 in the process of dopant implantation for the LDD formation. Further, when an SRAM is composed of the semiconductor storage elements 32 and the normal-structure MOSFETs that constitute the memory peripheral circuit part, the logic circuit part, the SRAM part and the like, it becomes easily achievable to compositely mount a nonvolatile memory, logic circuits and the SRAM on one chip.

In the case where a higher voltage needs to be applied to the semiconductor storage element 32 than is permitted in the logic circuit part, the SRAM part and the like, what is needed is only to add a high-voltage well-formation mask as well as a high-voltage gate-Insulator formation mask to the standard MOSFET formation mask. Conventionally, the process of compositely forming an EEPROM (electrically erasable programmable read-only memory) and a logic circuit part on one chip would involve a considerably increased number of necessary masks and process man-hours, as compared with the standard MOSFET process. This means that the present invention makes it possible to dramatically reduce the number of masks and the process man-hours, as compared with the case where the EEPROM and circuits such as the memory peripheral circuit, the logic circuit and the SRAM are compositely mounted. Thus, the yield of the chip formed with both normal-structure MOSFETs of the memory peripheral circuit part, the logic circuit part, the SRAM part and the like and the semiconductor storage elements 32 is improved, so that the cost is reduced.

Second Embodiment

FIGS. 4A-4F show another procedure for compositely mounting the semiconductor switching elements 31 (only one of which is shown) in the logic circuit area 4 and the semiconductor storage element 32 (only one of which is shown) in the memory area 5 on one identical semiconductor substrate 1. More specifically, it is shown that by performing the photolithography step and the succeeding dopant implantation step after the gate electrode 3 has been formed and before the material 10 for forming the charge retaining portions 11 is deposited on the gate side faces, LDD regions are formed selectively at locations where normal-structure MOSFETs are to be formed, by which the semiconductor switching elements 31 and the semiconductor storage elements 32 can be formed at the same time simply and without requiring any complex processes.

Figure 4A:
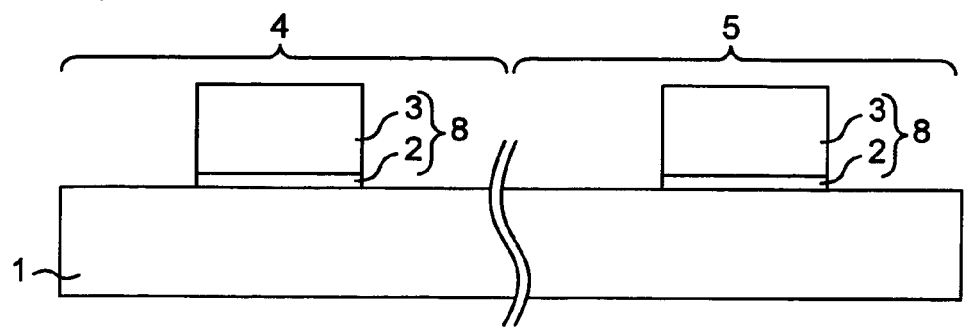
FIGS. 4A-4F are schematic sectional views showing the manufacturing process of a semiconductor storage device according to a second embodiment of the invention.

As shown in FIG. 4A, the gate insulator 2 and the gate electrode 3, i.e. the gate stack 8, which has been subjected to a MOS (Metal-Oxide-Semiconductor) formation process to provide the MOS structure is formed on the semiconductor substrate 1 having the P conductive type.

A typical MOS formation process is as follows.

First, a device isolation region (not shown) is formed by a known method on the semiconductor substrate 1 having a p-type semiconductor region. The device isolation region can prevent a leakage current from flowing through the substrate between mutually adjacent devices. However, mutually adjacent devices that share a source/drain region 13 do not need the formation of such a device isolation region. The aforementioned known device-isolation-region formation method may be a method using LOCOS oxide, or a method using trench isolation regions, or any other method as far as the method achieves the objective of isolating devices from each other.

Next, an insulating film 2 is formed entirely on the exposed surface of the semiconductor region (FIG. 4A shows an already patterned state). This insulating film 2, which is to serve as the gate insulator of the MOSFET, is desirably formed as a film having good performance as the gate insulator 2 by using process including $N_2O$ oxidation, NO oxidation, after-oxidation nitriding, and other steps. The film having good performance as the gate insulator 2 means a insulating film capable of suppressing disadvantageous factors in advancing scale-down and performance enhancement of MOSFETs, for example, suppressing the MOSFET short-channel effect, suppressing leakage currents that are currents unnecessarily flowing through the gate insulator 2, and suppressing the diffusion of the dopants of the gate electrode 3 into the MOSFET channel forming region while suppressing depletion of dopants of the gate electrode 3. A typical film is such an oxide film as thermal oxide film, $N_2O$ oxide film or NO oxide film, and the film thickness is appropriately within a range of 1 nm to 6 nm.

Next, the material for the gate electrode 3 (hereinafter, referred to as a "gate electrode material" and designated by the same reference numeral 3 as the gate electrode for simplicity's sake) is formed entirely on the gate insulator 2. As the gate electrode material 3, any material may be used only if it is capable of exhibiting the performance as MOSFET, such as polysilicon, doped polysilicon or other semiconductors, Al, Ti, W or other metals, compounds of these metals and silicon.

Next, a desired photoresist pattern is formed on the gate electrode material 3 by photolithography process, and with the resulting photoresist pattern used as a mask, the gate electrode material 3 and the gate insulator 2 are etched so as to be patterned as shown in FIG. 4A. Thus, the gate stack 8 is formed. In this process, it is not necessarily required to etch the gate insulator 2. When the gate insulator 2, without being etched, is utilized as an implantation protective film in the subsequent dopant implantation step, a step of forming an implantation protective film can be omitted.

Further, the gate stack 8 may also be formed by the following process. A gate insulator 2 having the same function as described above is formed entirely on the exposed surface of the semiconductor substrate 1 having a p-type semiconductor region. Next, a gate electrode material 3 having the same function as described above is formed on the gate insulator 2. Next, a mask insulating film formed of an oxide film, a nitride film, an oxynitride film or the like is formed on the gate electrode material 3. Next, a photoresist pattern having the same function as described above is formed on the mask insulating film, and then the mask insulating film is etched according to this photoresist pattern so as to be patterned. Next, the photoresist pattern is removed, and with the mask insulating film used as an etching mask, the gate electrode material 3 is etched. Next, the mask insulating film and the exposed portions of the gate insulator 2 are etched, by which the gate stack 8 is formed as shown in FIG. 4A. In this process, it is not necessarily required that the gate insulator 2 be etched. When the gate insulator 2, without being etched, is utilized as an implantation protective film in the subsequent dopant implantation step, a step of forming an implantation protective film can be omitted.

Figure 4B:
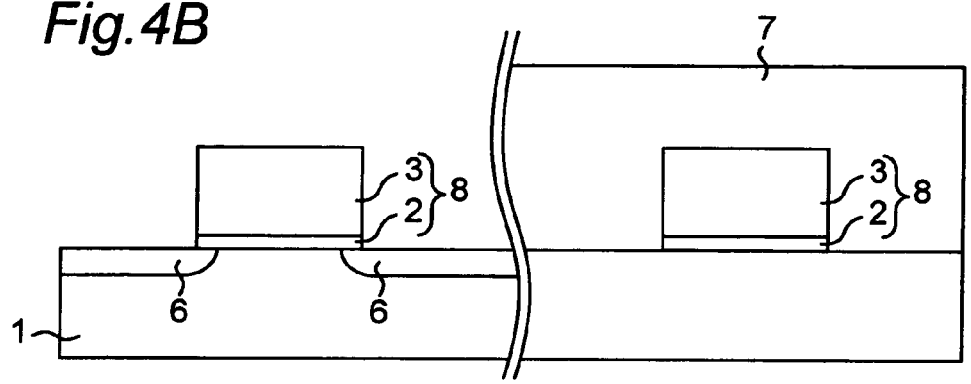

Next, LDD regions 6 are formed in the logic circuit area 4 as shown in FIG. 4B. In this step, in the memory area 5, because photoresist 7 has been formed, no LDD region is formed. In this way, while no LDD region 6 is formed in the memory area 5, the LDD regions 6 have been formed in the logic circuit area 4 where transistors of normal structure are to be formed. The photoresist, which is to prohibit the implantation, has only to be one that can be selectively removed. Therefore, an insulating film of nitride or the like may also be used in place of photoresist.

Figure 4C:
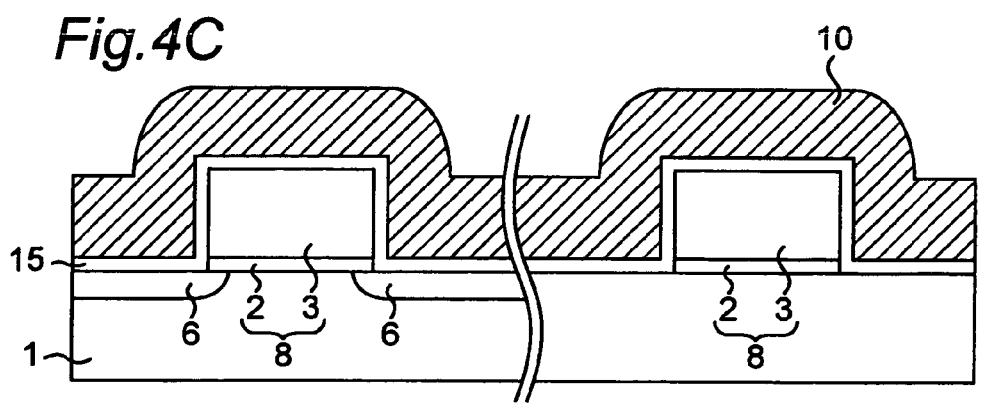

Next, as shown in FIG. 4C, a first insulating film 15 is formed on the gate stack 8 and the exposed surface of the semiconductor substrate 1. Here is shown a method of forming this first insulating film 15. The first insulating film 15 to be formed on the gate stack 8 and the exposed surface of the semiconductor substrate 1 will serve as an insulating film through which electrons are passed, and therefore is preferably given by a film which has a high withstand voltage, small leakage current and high reliability. For example, as with the material of the gate insulator 2, an oxide film such as thermal oxide, $N_2O$, or NO is used. With the use of such an oxide film, the film thickness is preferably about 1 nm to 20 nm. Further, with the insulating film 15 formed at such a thinness that a tunnel current passes therethrough, the voltage required for charge injection/erase can be made lower, by which a reduction in power consumption can be achieved. Typically, the film thickness in that case is preferably about 1 nm to 5 nm. Now, since the formation of the first insulating film 15 causes the charge retaining portions 11 to be in contact with the semiconductor substrate 1 and the gate electrode 3 via the first insulating film 15, leakage of retained charges can be suppressed by this insulating film. Thus, a semiconductor storage element 32 with good charge retention characteristics and long-term reliability is achieved.

Next, the material 10 for forming the charge retaining portions (i.e., a material having the function of storing electric charges) is deposited at a generally uniform thickness on the entire first insulating film 15. The material 10 of the charge retaining portions may be a material capable of retaining electrons and holes, such as nitride or oxynitride; a material having a charge trap, such as an oxide film; a material capable of inducing electric charge to the surfaces of the charge retaining portions 11 by polarization or other phenomena, such as a ferroelectric; a material having a structure that a charge-retainable substance such as floating polysilicon or silicon dots is contained in an oxide film, or the like. That is, the material 10 has only to be one capable of retaining or inducing electric charges. The film thickness of the material 10 for forming the charge retaining portions has only to be about 2 nm to 100 nm, for example, when a nitride film is used.

Figure 4D:
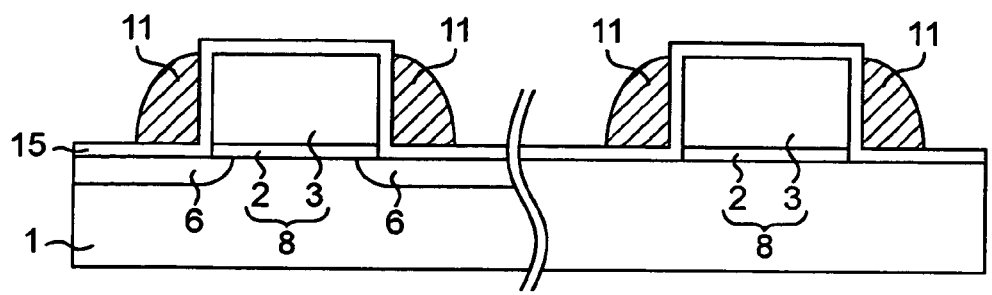

Next, as shown in FIG. 4D, the material 10 for forming the charge retaining portions is anisotropically etched, by which the charge retaining portions 11 are formed on the side faces of the gate stack 8. This etching may appropriately be performed under such conditions that allow the material 10 for forming the charge retaining portions to be selectively etched and that provide a large etching selection ratio of the material 10 to the first insulating film 15.

Figure 19B:
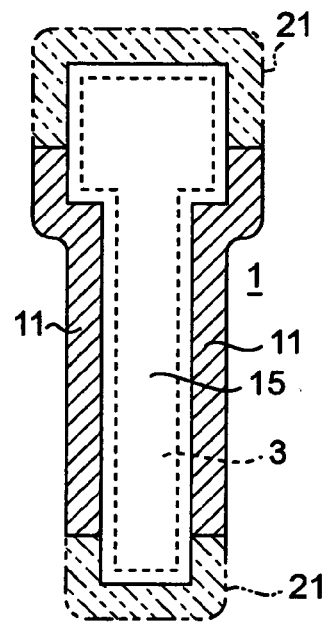

However, in the case where a material containing a substance having electrical conductivity such as conductor or semiconductor is used as the material 10 of the charge retaining portions, it is necessary that, after the formation of a charge retaining portion 11, the charge retaining portion 11 surrounding the outer peripheral surface of the gate electrode 3 should be made into separate charge retaining portions 11, 11 which are placed on the right and left of the gate electrode 3 and which are electrically insulated from each other. Therefore, as shown in FIG. 19B, portions (removal regions 21) of the annular charge retaining portion 11 are removed by etching. These removal regions 21 are shown as phantom-line hatched portions in front and rear positions of the annular charge retaining portion 11. A removal method therefor is to pattern the photoresist by using a known photolithography process so that the charge retaining portions 11 except the removal regions are covered therewith. Thereafter, by performing anisotropic etching, exposed portions (removal regions 21) of the charge retaining portions 11 are removed. This etching may appropriately be performed under such conditions that allow the charge retaining portions 11 to be selectively etched and that provide a large etching selection ratio of the charge retaining portion 11 to the gate electrode 3 and the semiconductor substrate 1. It is noted that the removal regions 21 are preferably positioned on the device isolation regions of the substrate.

Figure 4E:
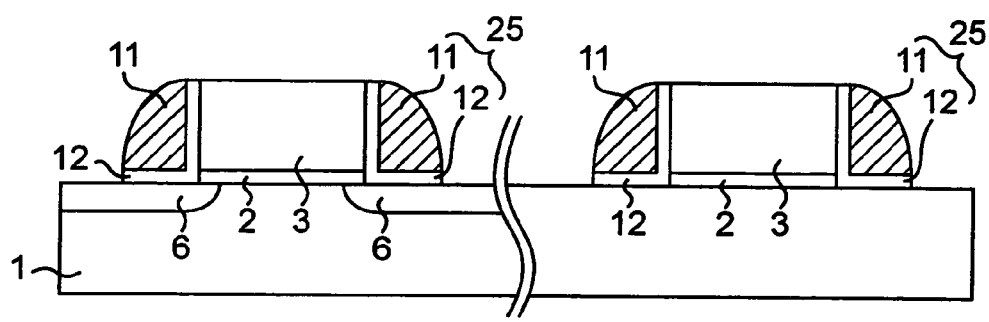
Figure 19C:
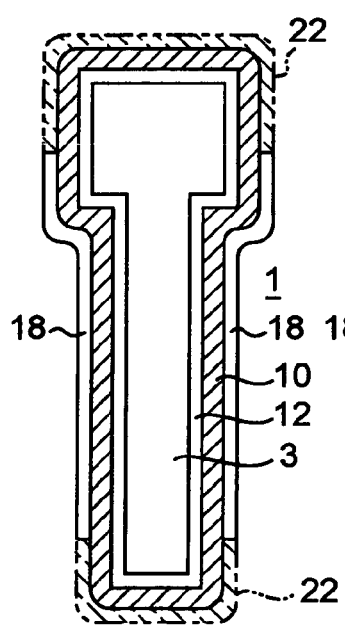
Figure 19D:
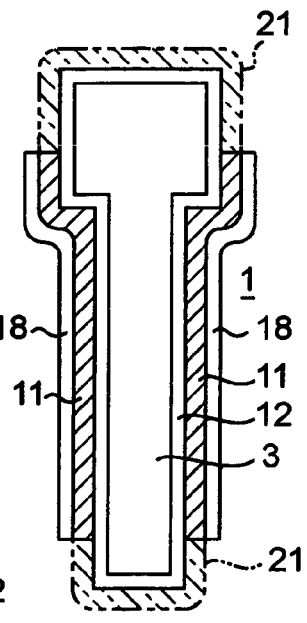
Figure 19E:
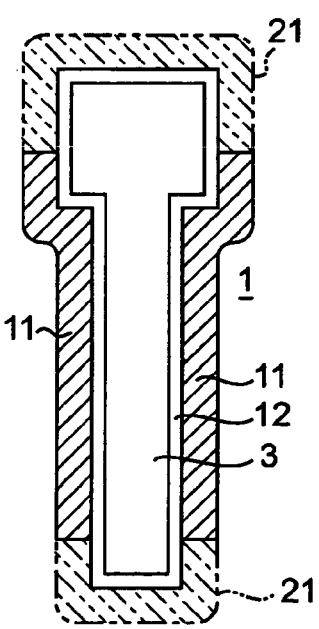

Next, as shown in FIG. 4E, anisotropic etching is performed on the first insulating film 15 so that only exposed portions are selectively removed, by which an L-shaped (where the term "L-shaped" merely refers to a shape having a corner between two members and not a shape having a right angle between two members. This definition is applicable to the term "L-shaped" in every occurrence hereinafter.) first insulator 12 made of part of the first insulating film 15 is obtained. This etching may appropriately be performed under such conditions that allow the first insulating film 15 to be selectively etched and that provide a large etching selection ratio of the first insulating film 15 to the material 10 for forming the charge retaining portions as well as to the gate electrode 3 material and the semiconductor substrate 1 material. In this way, a memory function body 25 composed of the first insulator 12 (first insulating film 15) and the charge retaining portions 11 is completed. It is noted that since this step employs anisotropic etching, part of the first insulator 12 that is not covered with the charge retaining portions 11 is removed. However, part of the first insulator 12 remains in such a state as shown in FIG. 19E. Now that part of the first insulator 12 remains in such a state as shown in FIG. 19E to cover the outer peripheries of the gate electrode, short-circuits between the contact of the source/drain and the gate electrode 3 can be suppressed. Thus, further scale-down becomes easier to achieve, and higher integration of the memory becomes implementable.

Alternatively, the structure shown in FIG. 4C through the structure shown in FIG. 4E may be treated in one step. That is, the process normally requiring two steps may be carried out by one step by performing an anisotropic etching that allows both the first insulating film 15 and the material 10 of charge retaining portions to be selectively etched and that employs a condition of large etching selection ratio to the gate electrode 3 material as well as to the semiconductor substrate 1 material. In such a case, the number of process steps can be reduced. However, in that case, when a material containing a substance having electrical conductivity such as conductor or semiconductor is used as the material 10 of the charge retaining portions, it is necessary that, after the formation of a charge retaining portion 11, the charge retaining portion 11 surrounding the outer peripheral surfaces of the gate electrode 3 should be made into separate charge retaining portions 11, 11 which are placed on the right and left of the gate electrode 3 and which are electrically insulated from each other. Therefore, as shown in FIG. 19E, portions (removal regions 21) of the annular charge retaining portion 11 are removed by etching. These removal regions 21 are shown as phantom-line hatched portions in front and rear portions of the annular charge retaining portions 11. A removal method therefor is to pattern the photoresist by using a known photolithography process so that the charge retaining portions 11 except the removal regions are covered therewith. Thereafter, by performing anisotropic etching, the removal regions 21 that are the exposed portions of the charge retaining portions 11 are removed. This etching may appropriately be performed under such conditions that allow the material 10 for forming the charge retaining portions to be selectively etched and that provide a large etching selection ratio of the material 10 to the first insulator 12 and to the gate electrode 3.

Figure 4F:
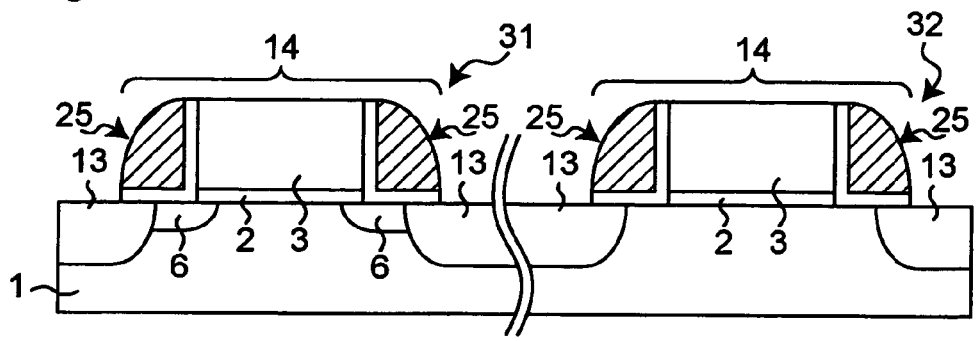

Next, as shown in FIG. 4F, with the gate electrode 3 and the memory function bodies 25, 25 on both sides thereof being used as an integral mask, source/drain implantation is performed, followed by a specified thermal treatment. In this way, the source/drain regions 13 are formed in a self-alignment fashion.

With the use of the above-described process, the semiconductor switching element 31 of a normal-structure MOSFET having LDD regions to be used for the logic circuit area 4, and the semiconductor storage element 32 of a nonvolatile memory element to be used for the memory area 5, can be concurrently formed on one substrate only by adding a simple process step and without employing any complex process steps.

Also, when electric charges are retained in the charge retaining portions 11, part of the channel forming region is strongly affected by the charges, causing the drain current value to change. Thus, the semiconductor storage element 32 is enabled to store information depending on the presence or absence of retained charges.

By providing the gate insulator 2 and the charge retaining portions 11 independently of each other, it has become possible to compositely mount the semiconductor switching element 31 of a normal-structure MOSFET and the semiconductor storage element 32 of a nonvolatile memory element on one chip without involving any large process change or process man-hour increase, compared with standard MOSFET process. Therefore, the manufacturing cost for compositely mounting the memory peripheral circuit part and the like 4 and the memory area 5 on one semiconductor substrate (chip) 1 can be reduced to a large extent.

The semiconductor storage element 32 having the source/drain regions 13 offset from the gate electrode 3 and the semiconductor switching element 31 in the logic circuit having the source/drain regions 13 not offset from the gate electrode 3 are formed on one identical substrate by a self-alignment like process. This means that it becomes possible to compositely mount nonvolatile memory elements having a high memory effect and normal MOSFETs in a logic circuit having a high current-driving power on one chip in a simple manner and without requiring any complex process steps.

Further, according to this semiconductor storage element 32, since the 2-bit storage per transistor can be realized, the memory-cell occupation area per bit can be reduced so that a large-capacity nonvolatile memory element can be realized.

Also, since the first insulator 12 is disposed between the charge retaining portions 11 and the semiconductor substrate 1 and the gate electrode 3, leakage of the retained charges can be suppressed by this insulator 12. Thus, a nonvolatile memory element good at charge retention characteristic and high in long-term reliability can be realized.

Third Embodiment

FIGS. 5A-5D show another procedure for compositely forming the semiconductor switching elements 31 (only one of which is shown) in the logic circuit area 4 and the semiconductor storage elements 32 (only one of which is shown) in the memory area 5 on one semiconductor substrate 1. More specifically, it is shown that, after the formation of the gate electrode 3 and before the deposition of the material 10 for forming the charge retaining portion 11 on the gate side surfaces, a photolithography step and a dopant implantation step subsequent thereto are performed to selectively form LDD regions at a location where a normal-structure MOSFET is to be formed, thus making it possible to form the semiconductor switching element 31 and the semiconductor storage element 32 simply and concurrently without requiring any complex process.

Until the LDD region formation step, the same steps as in the second embodiment may be used. Therefore, the same steps are neither illustrated nor explained any more. That is, the structure shown in FIG. 4B is formed by using the steps shown in the second embodiment, and thereafter photoresist is removed.

Figure 5A:
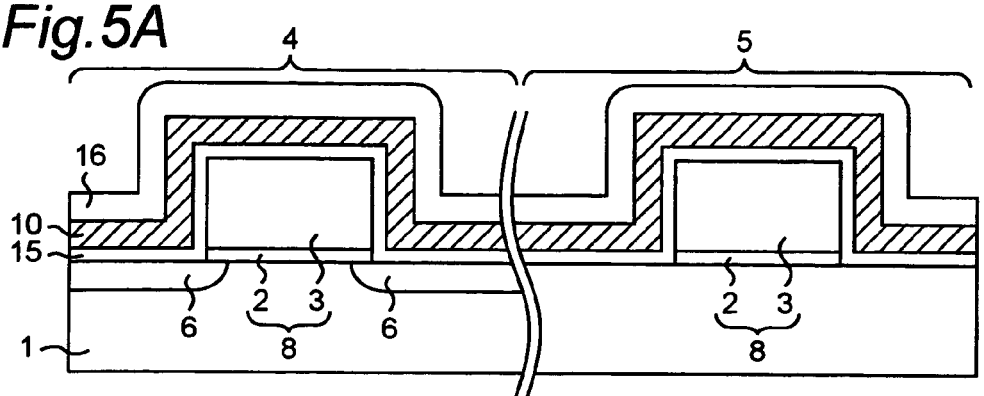
FIGS. 5A-5D are schematic sectional views showing the manufacturing process of a semiconductor storage device according to a third embodiment of the invention.

Next, as shown in FIG. 5A, a first insulating film 15 is formed at a generally uniform thickness on the gate stack 8 and exposed surfaces of the semiconductor substrate 1. This first insulating film 15, which becomes an insulating film through which electrons are passed, is preferably given by a film which has a high withstand voltage, small leakage current and high reliability. For example, an oxide film such as a thermal oxide film, $N_2O$ film, or NO film is used as in the case of the gate insulator 2. With the use of such an oxide film, the film thickness is preferably about 1 nm to 20 nm. Further, with the insulating film 15 formed at such a thinness that a tunnel current passes therethrough, the voltage required for charge injection/erase can be made lower, by which a reduction in power consumption can be achieved. Typically, the film thickness in that case is preferably about 1 nm to 5 nm. Now, since the formation of the first insulating film 15 causes the charge retaining portions 11 to come into contact with the semiconductor substrate 1 and the gate electrode 3 via the first insulating film 15, leakage of retained charges can be suppressed by this insulating film. Thus, a semiconductor storage element 32 superior in charge retention characteristic and high in long-term reliability is formed.

Next, the material 10 for forming the charge retaining portions (i.e., a material having the function of storing electric charges) is deposited at a generally uniform thickness on the entire first insulating film 15. The material 10 of the charge retaining portions may be a material capable of retaining electrons and holes, such as nitride or oxynitride; a material having a charge trap, such as an oxide film; a material capable of inducing electric charge to the surfaces of the charge retaining portions 11 by polarization or other phenomena, such as a ferroelectric; a material having a structure that a charge-retainable substance such as floating polysilicon or silicon dots is contained in an oxide film, or the like. That is, the material 10 has only to be one capable of retaining or inducing electric charges. The film thickness of the material 10 for forming the charge retaining portions has only to be about 2 nm to 100 nm, for example, when a nitride film is used.

Further, a second insulating film 16 is formed at a generally uniform thickness on the entire top surface of the material 10 for forming the charge retaining portions. This second insulating film is preferably given by a film which employs HTO (High Temperature Oxide) or other CVD (Chemical Vapor Deposition) oxide and which offers good step coverage. With the use of an HTO film, the film thickness has only to be about 5 nm to 100 nm.

Figure 5B:
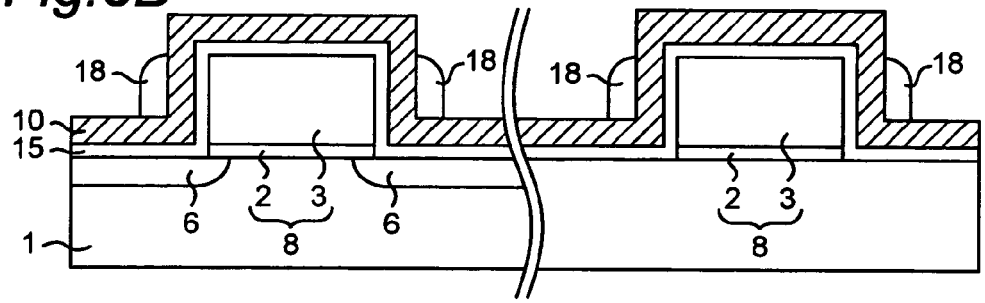

Next, as shown in FIG. 5B, the second insulating film 16 is anisotropically etched, by which a side-wall shaped second insulator 18 is formed around the side faces of the gate stack 8 with the interposition of the first insulating film 15 and the material 10 for forming the charge retaining portions. This etching may appropriately be performed under such conditions that allow the second insulating film 16 to be selectively etched and that provide a large etching selection ratio of the insulating film 16 to the material 10 for forming the charge retaining portions.

However, in the case where a material containing a substance having electrical conductivity such as conductor or semiconductor is used as the material 10 of the charge retaining portions, it is necessary that, after the formation of the charge retaining portion 11, the charge retaining portion 11 surrounding the outer peripheral surface of the gate electrode 3 should be made into separate charge retaining portions 11, 11 which are placed on the right and left of the gate electrode 3 and which are electrically insulated from each other. Therefore, as shown in FIG. 19C, portions (removal regions 22) of the annular second insulator 18 are removed by etching. These removal regions 22 are shown as phantom-line hatched portions in front and rear positions of the annular second insulator 18. A removal method therefor is to pattern the photoresist by using a known photolithography process so that the second insulator 18 except the removal regions is covered therewith. Thereafter, by performing anisotropic etching, the removal regions 22 that are exposed portions of the second insulator 18 are removed. This etching may appropriately be performed under such conditions that allow the second insulator 18 to be selectively etched and that provide a large etching selection ratio of the second insulator 18 to the material 10 for forming the charge retaining portions. It is noted that the removal regions 22 are preferably positioned on the device isolation regions of the substrate.

Figure 5C:
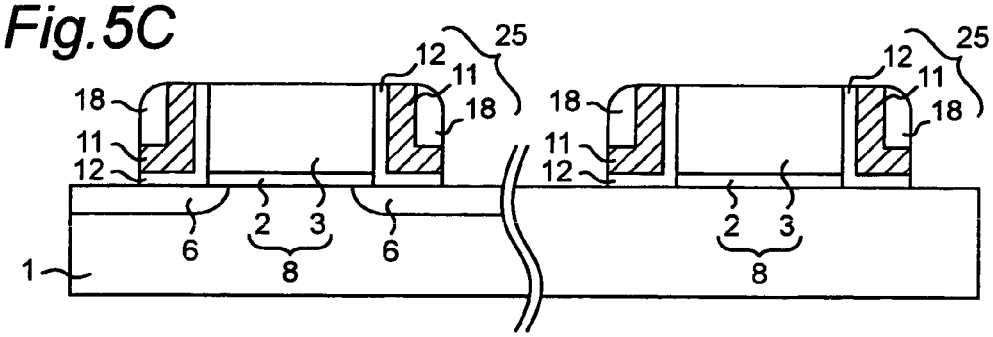

Next, as shown in FIG. 5C, with the second insulator 18 used as an etching mask, isotropic etching is performed on the material 10 for forming the charge retaining portion, by which the charge retaining portions 11 are formed on the opposite side faces of the gate stack 8 with the first insulating film 15 disposed therebetween. In this case, the etching may appropriately be performed under such conditions that allow the material 10 for forming the charge retaining portions to be selectively etched and that provide a large etching selection ratio to the first insulating film as well as to the second insulator 18. Since part (removal regions 22) of the second insulator 18 have been removed by etching in the preceding step shown in FIG. 19C and since the etching of this step employs isotropic etching technique, part (removal regions 21) of the charge retaining portion 11 is etched as well at this step, resulting in a configuration as shown in FIG. 19D. Thus, the right and left charge retaining portions 11, 11 are electrically insulated from each other.

Next, the first insulating film 15 is anisotropically etched, by which the first insulator 12 is formed on the side faces of the gate stack 8. In this case, the etching may appropriately be performed under such conditions that allow the first insulator 12 to be selectively etched and that include a large etching selection ratio to the second insulator 18, the charge retaining portions 11 and the semiconductor substrate 1. Thus, a memory function body 25 composed of the first insulator 12 (first insulating film 15), the charge retaining portions 11 and the second insulator 18 (second insulating film 16) has been formed. In this case, where the removal regions 21 of the charge retaining portions 11 and the removal regions 22 of the second insulator 18 are removed by etching, since this step employs anisotropic etching, part of the first insulator 12 that is not covered with the charge retaining portions 11 is etched. However, part of the first insulator 12 remains in such a state as shown in FIG. 19D. Now that part of the first insulator 12 remains in such a state as shown in FIG. 19D to cover the outer peripheries of the gate electrode 3, a short-circuit between the contact of the source/drain and the gate electrode 3 can be suppressed. Thus, further scale-down becomes easier to achieve, and higher integration of the memory becomes implementable.

However, there is a case where the first insulator 12 and the second insulator 18 are made of such an identical material as oxide film, in which case a large etching selection ratio cannot be obtained. Therefore, in such a case, it is necessary that, in consideration of the etching amount of the second insulator 18 in the process of etching of the first insulating film 15, the etching amount in the formation of the second insulator 18 should be lessened correspondingly.

Alternatively, the structure shown in FIG. 5A through the structure shown in FIG. 5C may be treated in one step. That is, the process normally requiring three steps may be carried out by one step by performing an anisotropic etching employing such conditions that allow all of the first insulating film 15, the second insulating film 16 and the material 10 of charge retaining portions to be selectively etched and that include a large etching selection ratio to the gate electrode 3 material as well as to the semiconductor substrate 1 material. In such a case, the number of process steps can be reduced. However, in that case, when a material containing a substance having electrical conductivity such as conductor or semiconductor is used as the material 10 of the charge retaining portions, it is necessary that, after the formation of a charge retaining portion 11, the charge retaining portion 11 surrounding the outer peripheral surface of the gate electrode 3 should be made into charge retaining portions 11, 11 which are placed on the right and left of the gate electrode 3 and which are electrically insulated from each other. Therefore, as shown in FIG. 19C, portions (removal regions 22) of the annular second insulator 18 are removed by etching. These removal regions 22 are shown at phantom-line hatched portions in front and rear portions of the annular second insulator 18. A removal method therefor is to pattern the photoresist by using known photolithography process so that the second insulator 18 except the removal regions is covered therewith. Thereafter, by performing anisotropic etching, the removal regions 22 that are the exposed portions of the second insulator 18 are removed. This etching may appropriately be performed under such conditions that allow the second insulator 18 to be selectively etched and that include a large etching selection ratio to the material 10 for forming the charge retaining portions. Further, as shown in FIG. 19D, part (removal regions 21) of the annular charge retaining portions 11 are removed by etching. These removal regions 21 are shown at phantom-line hatched portions in front and rear portions of the annular charge retaining portions 11. A removal method therefor is to pattern the photoresist by using known photolithography process so that the charge retaining portions 11 except the removal regions are covered therewith. Thereafter, by performing anisotropic etching, the removal regions 21 that are exposed portions of the charge retaining portions 11 are removed. This etching may appropriately be performed under such conditions that allow the material 10 for forming the charge retaining portions to be selectively etched and that include a large etching selection ratio to the first insulator 12. Since the first insulator 12 remains at this step so as to cover the outer peripheries of the gate electrode 3, short-circuits between the contact of the source/drain and the gate electrode 3 can be suppressed. Thus, further scale-down becomes easier to achieve, and higher integration of the memory becomes implementable.

Figure 5D:
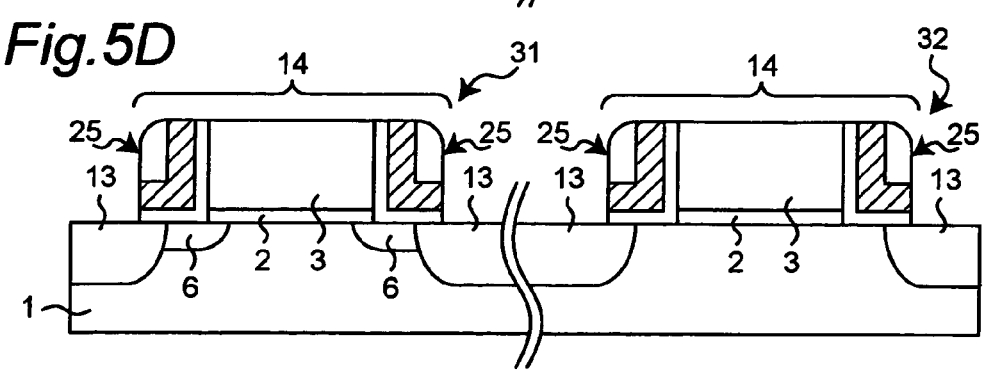

Next, as shown in FIG. 5D, while the gate electrode 3 and the memory function bodies 25, 25 on both sides thereof are used as an integral mask 14, source/drain implantation is performed, followed by a specified thermal treatment. Thus, the source/drain region 13 can be formed in a self-alignment fashion.

With the use of the above-described process, the semiconductor switching element 31 of a normal-structure MOSFET in which an LDD region to be used for the logic circuit area 4 has been formed, and the semiconductor storage element 32 of a nonvolatile memory element to be used for the memory area 5, can be easily formed on one identical substrate concurrently only by adding simple process without employing any complex process.

Also, when electric charge is retained in the charge retaining portions 11, part of the channel forming region is strongly affected by the charge, causing the drain current value to change. A nonvolatile memory element that distinguishes the presence or absence of electric charge according to the change in drain current value can be realized.

By providing the gate insulator 2 and the charge retaining portions 11 independently of each other, a memory cell transistor having a short-channel effect of similar level can be formed at the same time by the same manufacturing process as normal-structure MOSFETs. Therefore, the process of compositely mounting the logic circuit area 4 and the memory area 5 can be carried out quite simply.

According to this nonvolatile memory element, while the 2-bit storage per transistor is realized, the short-channel effect can be reduced to a large extent, so that further scale-down becomes achievable. Further, higher-speed operation and lower-power consumption can be realized.

Also, since the charge retaining portions 11 are in contact with the semiconductor substrate 1 and the gate electrode 3 via the first insulating film 15, leakage of the retained charge can be suppressed by this insulating film 15. Thus, a nonvolatile memory element good at charge retention characteristic and high in long-term reliability can be realized.

Also, since the charge retaining portions 11 are L-shaped, the charge retaining portions can be made even smaller in scale. Therefore, the charge retaining portions 11 can be formed in vicinities of the channel, thus making it more easily achievable to erase and remove electrons that have been write-injected into the parts. Thus, erase failure can be prevented. Further, scaling down the charge retaining portions allows the charge erase to be efficiently achieved, so that a nonvolatile memory element fast in read and erase speed and high in reliability can be realized.

In the case where a conductor or semiconductor is used as the charge retaining portions 11, applying a positive voltage to the gate electrode 3 causes polarization in the charge retaining portions 11, which in turn causes electrons to be induced in vicinities of the side faces of the gate electrode 3, so that the amount of electrons in vicinities of the channel forming region decreases. Thus, the injection of electrons from the semiconductor substrate 1 or the source/drain regions 13 can be accelerated, so that a nonvolatile memory element fast in write speed and high in reliability can be formed.

Fourth Embodiment

A fourth embodiment of the present invention will be described below with reference to FIG. 6.

This embodiment relates to a concrete example of the semiconductor storage element having memory function bodies on opposite sides of the gate electrode shown in FIG. 5D relating to the third embodiment. In addition to the described advantages of the third embodiment, additional advantages will be provided, which will be described later.

In a semiconductor storage element in this embodiment as shown in FIG. 5, each memory function bodies 161, 162 is composed of a charge retaining portion (a region for storing electric charges, which may be a film having a function of holding electric charges) and a region for obstructing release of electric charges (which may be a film having a function of obstructing release of electric charges). The memory function body has, for example, ONO (Oxide Nitride Oxide) structure, as shown in FIG. 6. More specifically, the memory function bodies 161, 162 are each structured in the state that a silicon nitride film 142 is interposed between a silicon oxide film 141 and a silicon oxide film 143. Here, the silicon nitride film 142 implements a function of holding electric charges. The silicon oxide films 141, 143 implement a function of obstructing release of the electric charges stored in the silicon nitride film.

Also, the charge retaining portions (silicon nitride films 142) in the memory function bodies 161, 162 are overlapped with the source/drain regions 112, 113. Herein, the term "overlap" is used to refer to the state that at least part of the charge retaining region (silicon nitride film 142) is present on at least part of the source/drain region 112, 113. There are also shown a semiconductor substrate 111, a gate insulating film 114, a gate electrode 117, and offset regions 171 (between the gate electrode and the source/drain regions). Though not shown in the drawing, the uppermost surface area of the semiconductor substrate 111 under the gate insulating film 114 serves as a channel forming region.

Description will be given of an effect of overlapping the charge retaining portion 142 in the memory function bodies 161, 162 and the source/drain regions 112, 113.

Figure 6:
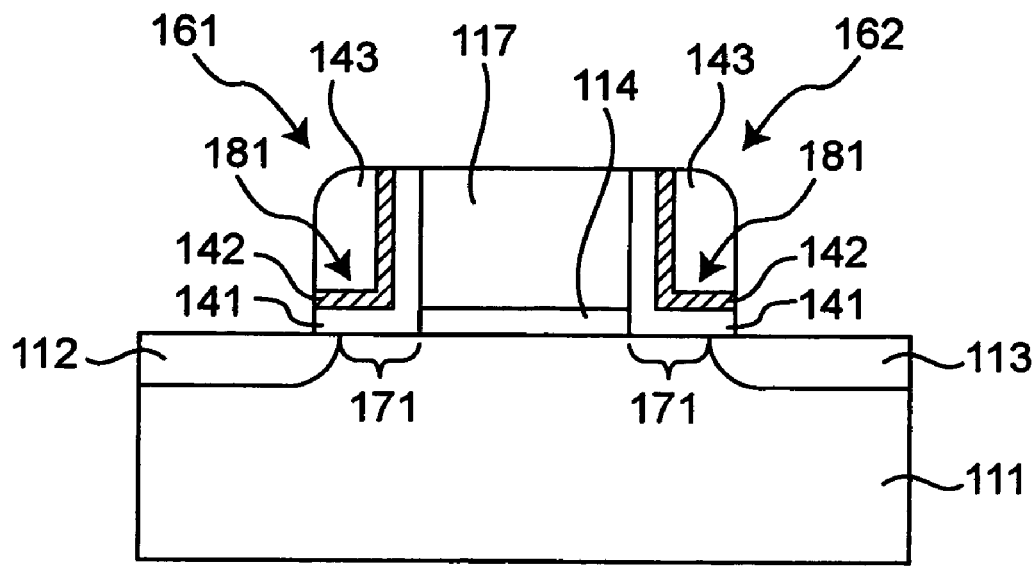
FIG. 6 is a schematic sectional view showing the structure of a semiconductor storage element according to a fourth embodiment of the invention.
Figure 7:
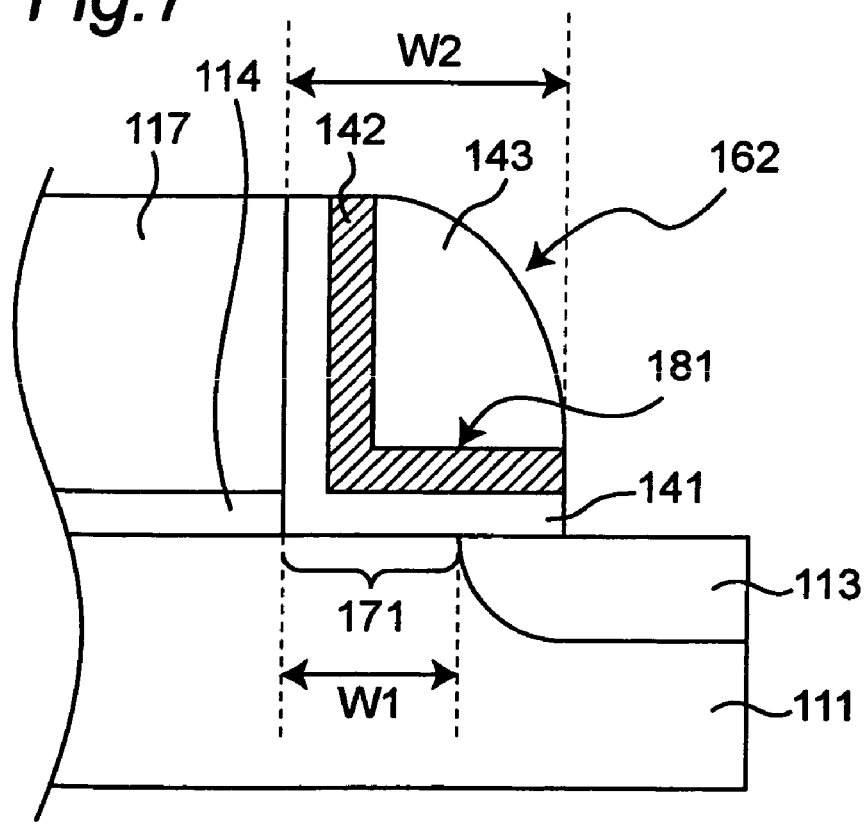
FIG. 7 is an enlarged view of a memory function body of the semiconductor storage element shown in FIG. 6 as well as a peripheral portion thereof.

FIG. 7 is an enlarged view showing the vicinity of the memory function body 162 that is on the right side of FIG. 6. Reference numeral W1 denotes an offset amount between the gate insulating film 114 and the source/drain region 113. Also, reference numeral W2 denotes the width of the memory function body 162 on the cross sectional plane in gate length direction of the gate electrode. Since an edge of the silicon nitride film 142 on the side away from the gate electrode 117 in the memory function body 162 is aligned with an edge of the memory function body 162 on the side away from the gate electrode 117, the width of the memory function body 162 is defined as W2. An overlap amount between the memory function body 162 and the source/drain region 113 is represented by an expression of W2-W1. What is particularly important is that the silicon nitride film 142 constituting the charge retaining portion in the memory function body 162 is overlapped with the source/drain region 113, that is, the silicon nitride film 142 is configured such that the relation of W2>W1 is satisfied.

Figure 8:
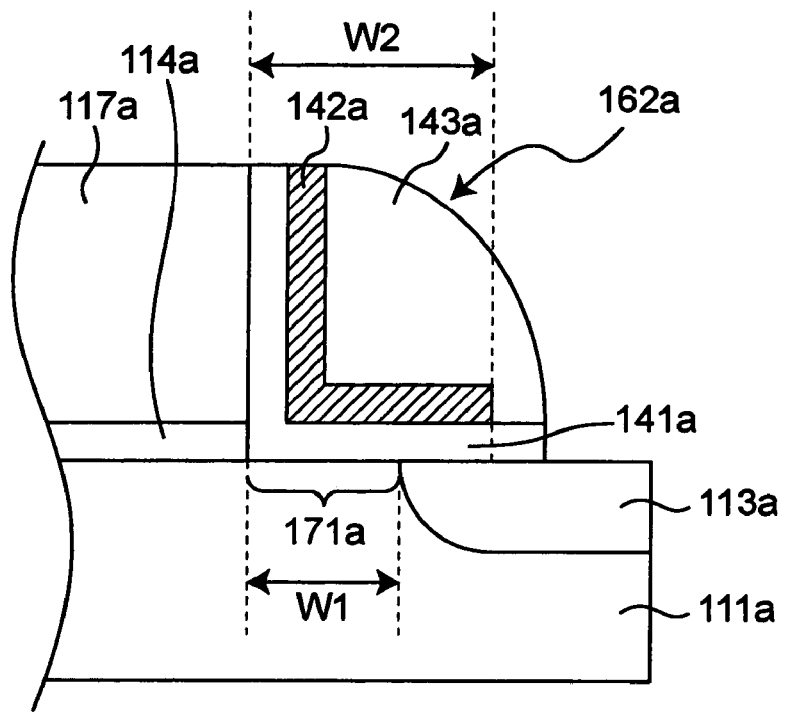
FIG. 8 is a view showing an aspect that, in comparison with the FIG. 7 embodiment, an end farther from the gate electrode of a silicon nitride film of a memory function body is not coincident with an end farther from the gate electrode of the memory function body.

In the case where the edge of the silicon nitride film 142a on the side away from the gate electrode in the memory function body 162a is not aligned with the edge of the memory function body 162a on the side away from the gate electrode as shown in FIG. 8, W2 may be defined as the width from the edge of the gate electrode to the edge of the silicon nitride film 142a on the side away from the gate electrode. Constituent parts shown in FIG. 8 are designated by the numerals used in FIG. 7 for the corresponding constituent parts, with additional symbol, "a."

Figure 9:
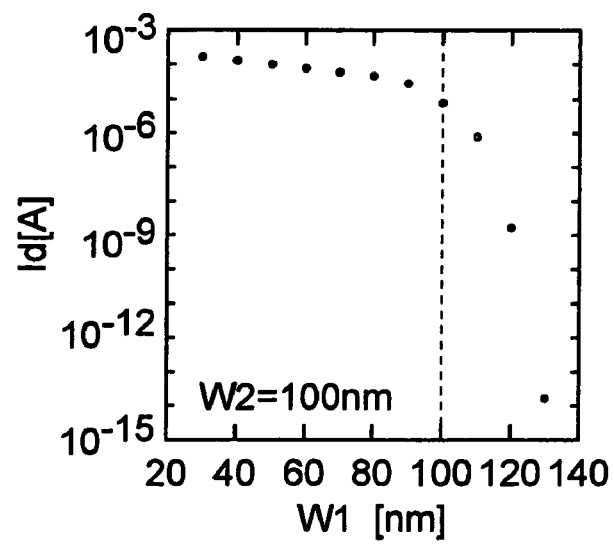
FIG. 9 is a graph plotting the offset, W1, along the axis of abscissas and the drain current, Id, along the axis of ordinate.

FIG. 9 shows a drain current Id in the structure of FIG. 7 with the width W2 of the memory function body 162 being fixed to 100 nm and with the offset amount W1 being varied. Herein, the drain current is obtained by device simulation performed under the conditions that the memory function body 162 is in erased state (holes are stored), and that the source/drain regions 112, 113 are set to be a source electrode and a drain electrode, respectively.

As shown in FIG. 9, with W1 being 100 nm or more (i.e., when the silicon nitride film 142 and the source/drain region 113 are not overlapped), the drain current shows rapid reduction. Since a drain current value is almost in proportion to a read operation speed, memory performance is rapidly deteriorated when W1 is 100 nm or more. In the range where the silicon nitride film 142 and the source/drain region 113 are overlapped, the drain current shows mild reduction. Therefore, when considering even variations or dispersion caused by mass production, it is practically difficult to obtain the memory function unless at least part of the silicon nitride film 142 that is a film having a function of holing electric charges is overlapped with the source/drain region.

Based on the above-described result of the device simulation, memory cell arrays are manufactured with W2 being fixed to 100 nm, and with W1 being set to 60 nm and 100 nm as design values. When W1 is 60 nm, the silicon nitride film 142 is overlapped with the source/drain regions 112, 113 by 40 nm as a design value, and when W1 is 100 nm, there is no overlap as a design value. As a result of measuring read times of these memory cell arrays and comparing them in worst cases considering dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2−W1>10 nm was more preferable in consideration of manufacturing dispersion.

For reading information stored in the memory function body 161 (region 181), it is preferable to set the source/drain region 112 as a source electrode and the source/drain region 113 as a drain region and to form a pinchoff point on the side closer to the drain region of the channel forming region. More specifically, in reading information stored in one of two memory function bodies, the pinchoff point is preferably formed in a region closer to the other memory function body of the channel forming region. This makes it possible to detect stored information in one memory function body 161, for example, with good sensitivity regardless of the storage condition of the other memory function body 162, resulting in large contribution to implementation of two-bit operation.

In the case of storing information only in one of the two memory function bodies, or in the case of using these two memory function bodies in the same storing condition, a pinchoff point is not necessarily formed in read operations.

Although not shown in FIG. 6, a well region (P type well in the case of N-channel device) is preferably formed at the surface of the semiconductor substrate 111. Forming the well region facilitates control of electrical characteristics (withstand voltage, junction capacitance, and short channel effect) while maintaining impurity concentration of the channel forming region optimum for memory operations (rewrite operation and read operation).

From the viewpoint of improving memory holding characteristic, the memory function body preferably incorporates a charge retaining portion having a function of retaining or holing electric charges, and an insulating film (anti-dissipation insulator). This embodiment uses the silicon nitride film 142 as a charge retaining portion having levels for trapping electric charges, and the silicon oxide films 141, 143 as insulating films having a function of preventing the electric charges stored in the charge retaining portion from dispersing. The memory function body having the charge retaining portion and the insulating film makes it possible to prevent electric charges from dissipating and to improve holding characteristic. Further, compared with a memory function body composed of only a charge retaining portion, it becomes possible to appropriately decrease the volume of the charge retaining portion. Appropriate decrease of the volume of the charge retaining portion makes it possible to restrain movement of electric charges in the charge retaining portion and to control occurrence of characteristic change due to movement of electric charges during memory holding.

Figure 10:
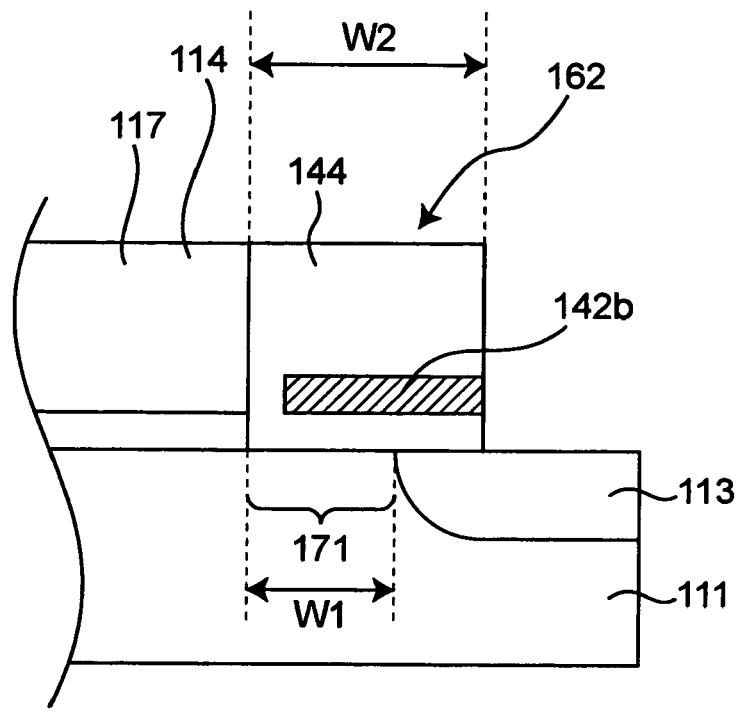
FIG. 10 shows that a silicon nitride film of a memory function body is disposed generally parallel to a surface of a gate insulating film.

Also, it is preferable that the memory function body contains a charge retaining portion disposed approximately parallel to the surface of the gate insulating film. In other words, it is preferable that the surface of the charge retaining portion in the memory function body is disposed so as to be at a constant distance from the surface of the gate insulating film. More particularly, as shown in FIG. 10, a charge retaining portion 142b in the memory function body 162 has a face approximately parallel to the surface of the gate insulating film 114. In other words, the charge retaining portion 142b is preferably formed to have a uniform height from the height corresponding to the surface of the gate insulating film 114. The presence of the charge retaining portion 142b approximately parallel to the surface of the gate insulating film 114 in the memory function body 162 makes it possible to effectively control formation of an inversion layer in the offset region 171 with use of an amount of electric charges stored in the charge retaining portion 142b, thereby enabling increase of memory effect. Also, by placing the charge retaining portion 142b approximately parallel to the surface of the gate insulating film 114, change of memory effect is kept relatively small even with a dispersed offset amount (W1), enabling restraint of memory effect dispersion. In addition, movement of electric charges toward upper side of the charge retaining portion 142b is controlled, and therefore characteristic change due to the movement of electric charges during memory holding can be restrained.

Furthermore, the memory function body 162 preferably contains an insulating film (e.g., a portion of the silicon oxide film 144 on the offset region 171) that separates the charge retaining portion 142b approximately parallel to the surface of the gate insulating film 114 from the channel forming region (or the well region). This insulating film restrains dissipation of the electric charges stored in the charge retaining portion, thereby contributing to obtaining a semiconductor storage element with better holding or retaining characteristics.

It is noted that controlling the film thickness of the charge retaining portion 142b as well as controlling the film thickness of the insulating film under the charge retaining portion 142b (a portion of the silicon oxide film 144 on the offset region 171) to be constant make it possible to keep the distance from the surface of the semiconductor substrate to the electric charges stored in the charge retaining portion approximately constant. More particularly, the distance from the surface of the semiconductor substrate to the electric charges stored in the charge retaining portion 142b can be controlled to be within the range of from a minimum film thickness value of the insulating film under the charge retaining portion 142b to the sum of a maximum film thickness of the insulating film under the charge retaining portion 142b and a maximum film thickness of the charge retaining portion 142b. Consequently, the concentration of electric lines of force generated by the electric charges stored in the charge retaining portion 142b becomes roughly controllable, and therefore dispersion of the degree of memory effect of the semiconductor memory devices can be minimized.

Fifth Embodiment

Figure 11:
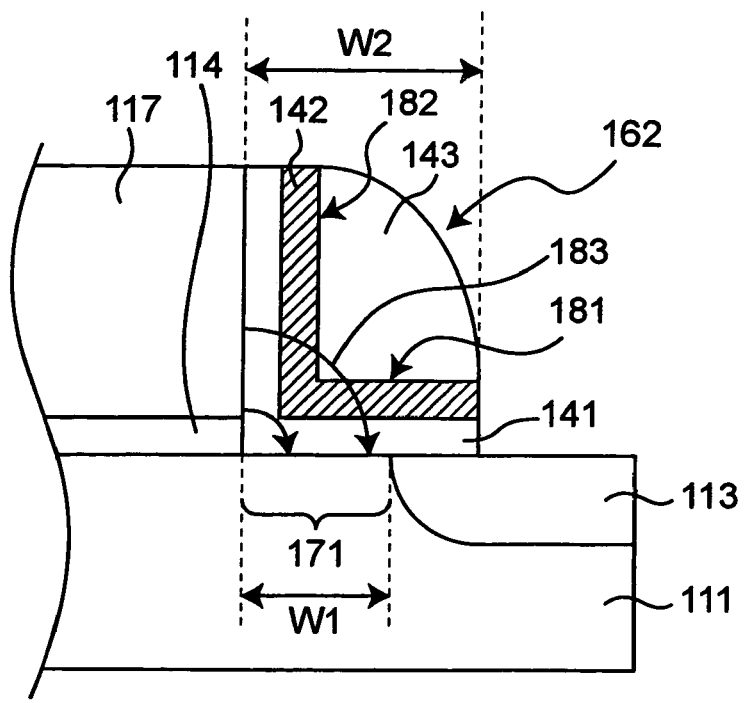
FIG. 11 is a schematic sectional view showing the structure of a semiconductor storage device according to a fifth embodiment of the invention.

In a fifth embodiment, a charge retaining portion 142 in the memory function body 162 has an approximately uniform film thickness as shown in FIG. 11. Further, the charge retaining portion 142 is configured such that a part thereof (indicated by 181) extends roughly parallel to the surface of the gate insulating film 114 and another part (indicated by 182) extends roughly parallel to a side face of the gate electrode 117.

When a positive voltage is applied to the gate electrode 117, an electric line of force in the memory function body 162 passes the silicon nitride film 142 (at locations designated by 182 and 181) totally twice, as shown by arrow 183. It is noted that when a negative voltage is applied to the gate electrode 117, the direction of the electric line of force is reversed. Herein, a relative permittivity, or dielectric constant of the silicon nitride film 142 is approx. 6, while a dielectric constant of silicon oxide films 141, 143 is approx. 4. Eventually, an effective dielectric constant of the memory function body 162 in the direction of electric line of force 183 becomes larger than that in the case where the charge retaining portion 142 includes only the portion 181, which makes it possible to decrease the potential difference between both edges of the electric line of force. More specifically, a large part of the voltage applied to the gate electrode 117 is used to reinforce electric fields in the offset region 171.

Electric charges are injected into the silicon nitride film 142 in rewrite operations because generated electric charges are pulled by electric fields in the offset region 171. As a consequence of the charge retaining portion 142 including the portion 182, increased electric charges are injected into the memory function body 162 in rewrite operations, thereby increasing a rewrite speed.

In the case where the silicon oxide film 143 is replaced with a silicon nitride film, more specifically, in the case where the upper surface of the charge retaining portion is not at a constant height relative to the surface of the gate insulating film 114, movement of electric charges toward upper side of the silicon nitride film becomes outstanding, and holding characteristics are deteriorated.

Instead of silicon oxide film, the charge retaining portion is more preferably formed from high-dielectric substances such as hafnium oxide having an extremely large dielectric constant, or relative permittivity.

Further, the memory function body more preferably includes an insulating film (a portion of the silicon oxide film 141 on the offset region 171) that separates the charge retaining portion approximately parallel to the surface of the gate insulating film from the channel forming region (or the well region). This insulating film restrains dissipation of the electric charges stored in the charge retaining portion, thereby enabling further improvement of holding characteristics.

Also, the memory function body more preferably includes an insulating film (a portion in contact with the gate electrode 117 of the silicon oxide film 141) that separates the gate electrode from the charge retaining portion extending in the direction approximately parallel to the side face of the gate electrode. This insulating film prevents injection of electric charges from the gate electrode into the charge retaining portion to thereby prevent change of electrical characteristics, which may increase reliability of the semiconductor storage element.

Further, similar to the fourth embodiment, it is preferable that the film thickness of the insulating film under the charge retaining portion 142 (a portion of the silicon oxide film 141 on the offset region 171) is controlled to be constant, and further the film thickness of the insulating film disposed on the side face of the gate electrode (a portion of the silicon oxide film 141 in contact with the gate electrode 117) is controlled to be constant. Consequently, the concentration of electric lines of force generated by the electric charges stored in the charge retaining portion 142 becomes roughly controllable, and leakage of electric charges can be prevented.

Sixth Embodiment

The present embodiment relates to optimization of the distance between a gate electrode, a memory function body, and a source/drain region.

Figure 12:
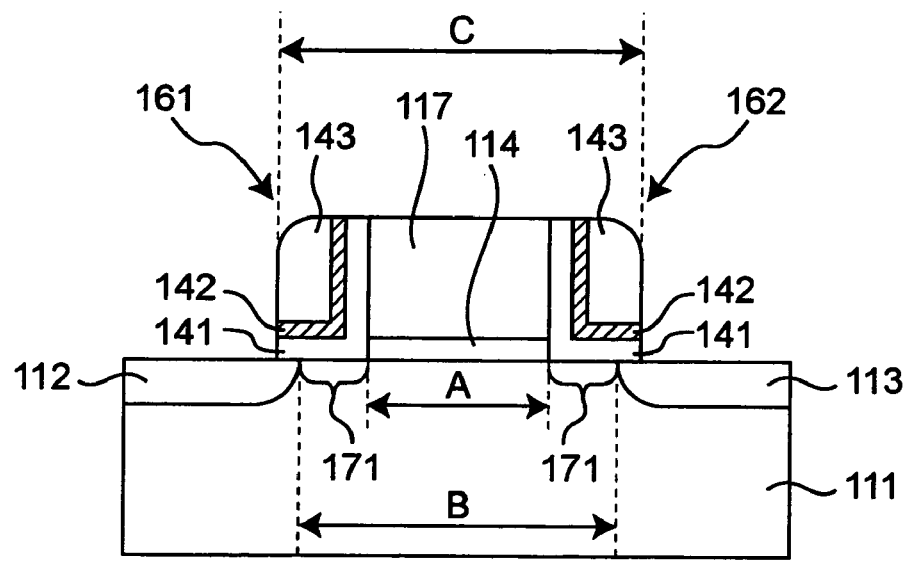
FIG. 12 is a schematic sectional view showing the structure of a semiconductor storage device according to a sixth embodiment of the invention.

As shown in FIG. 12, reference symbol A denotes a gate electrode length in the cross section in the gate length direction, reference symbol B denotes a distance (channel length) between source and drain regions, and reference symbol C denotes a distance from an outer edge of one memory function body to an outer edge of the other memory function body, more specifically a distance from the outer edge (on the side away from the gate electrode) of a film having a function of holding the electric charges in one memory function body to the outer edge (on the side away from the gate electrode) of a film having a function of holding the electric charges in the other memory function body in the cross section in the gate length direction.

First, it is preferable that the relationship of B<C holds. In the channel forming region, there is present an offset region 171 between a portion under the gate electrode 117 and each of the source/drain regions 112, 113. Since B<C, the electric charges stored in the memory function bodies 161, 162 (silicon nitride films 142) effectively vary invertibility in the entire part of the offset region 171. As a result, memory effect is increased, and a high-speed read operation is particularly enabled.

Also, when the gate electrode 117 and the source/drain regions 112, 113 are offset relative to each other, that is, when a relationship of A<B is satisfied, invertibility of the offset region when a voltage is applied to the gate electrode is largely changed by an electric charge amount stored in the memory function bodies. Consequently, memory effect increases and short channel effect can be reduced. However, as long as the memory effect is effective, the offset region is not necessarily required. Even when the offset region 171 is not present, if the impurity concentration in the source/drain regions 112, 113 is sufficiently small, the memory effect can still be effective in the memory function bodies 161, 162 (silicon nitride film 142). Therefore, the state of A<B<C is most preferable.

Seventh Embodiment

Figure 13:
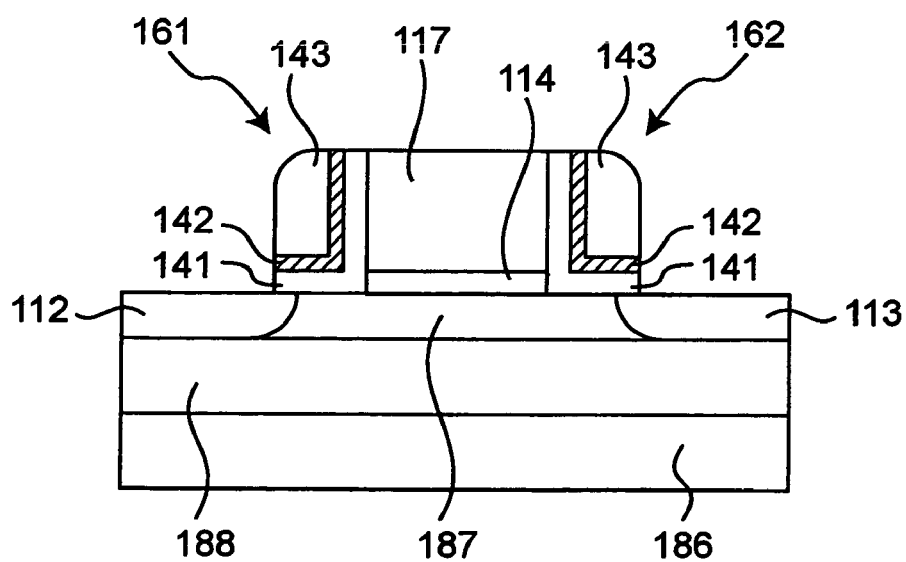
FIG. 13 is a schematic sectional view showing the structure of a semiconductor storage device according to a seventh embodiment of the invention.

A semiconductor storage element in a seventh embodiment has essentially the same structure as that in the fourth embodiment except that in the present embodiment, the semiconductor substrate is an SOI substrate, as shown in FIG. 13.

The semiconductor storage element is structured such that a buried oxide film 188 is formed on a semiconductor substrate 186, and on top of the buried oxide film 188, an SOI layer is further formed. In the SOI layer, there are formed source/drain regions 112, 113, and other areas constitute a body region 187.

This semiconductor storage element also brings about the effects similar to those of the semiconductor storage element in the fourth embodiment. Further, since the junction capacitance between the source/drain regions 112, 113 and the body region 187 can be considerably reduced, it becomes possible to increase a device speed and to decrease power consumption.

Eighth Embodiment

Figure 14:
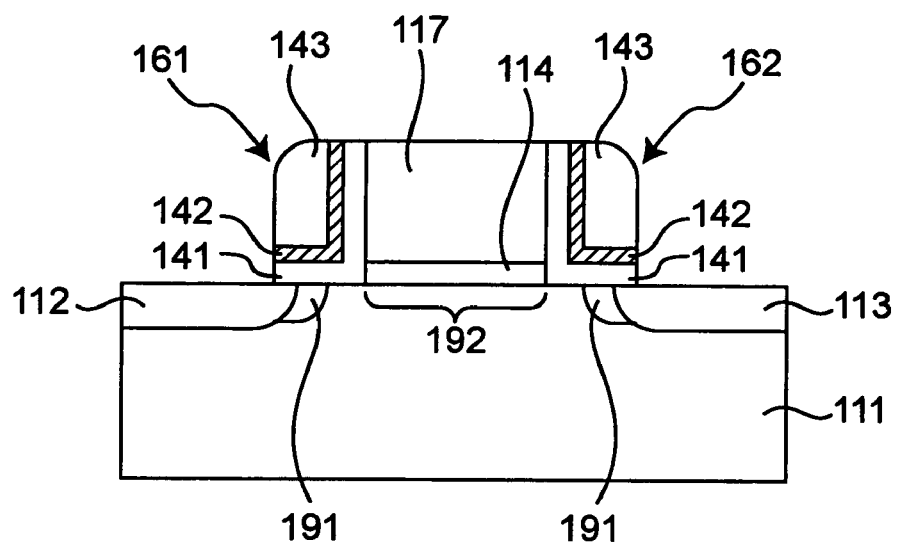
FIG. 14 is a schematic sectional view showing the structure of a semiconductor storage device according to an eighth embodiment of the invention.

A semiconductor storage element in this eighth embodiment has essentially the same structure as that in the fourth embodiment, except that in the eighth embodiment, a P type highly-concentrated region 191 is provided, as shown in FIG. 14, in the vicinity of the channel side of N type source/drain regions 112, 113.

More specifically, the concentration of P type impurity (e.g., boron) in the P type highly-concentrated region 191 is higher than the concentration of P type impurity in the region 192. An appropriate value of the P type impurity concentration in the P type highly-concentrated region 191 is, for example, around $5\times10^{17}$ to $1\times10^{19}$ cm$^{-3}$. Also, a value of the P type impurity concentration in the region 192 may be set to, for example, $5\times10^{16}$ to $1\times10^{18}$ cm$^{-3}$.

Providing the P type highly-concentrated region 191 makes the junction between the source/drain region 112, 113 and the semiconductor substrate 111 steep right under the memory function bodies 161, 162. This facilitates generation of hot carriers in write and erase operations, thereby enabling reduction of voltage in write operations and erase operations or implementing high-speed write operations and erase operations. Further, since the impurity concentration in the region 192 is relatively low, a threshold value when the memory is in erased state is small and so the drain current becomes large. Consequently, a read speed is increased. This makes it possible to provide a storage element having low rewrite voltage or a high rewrite speed, and having a high read speed.

Also in FIG. 14, by providing the P type highly-concentrated region 191 in a position adjacent to the source/drain region and on the lower side of the memory function body (that is a position not right under the gate electrode), a threshold value of the entire transistor shows considerable increase. The degree of this increase is extremely larger than that in the case where the P type highly-concentrated region 191 is right under the gate electrode. When write electric charges (electrons in the case where the transistor is N channel type) are stored in the memory function bodies 161, 162, the difference becomes larger. When enough erase electric charges (holes in the case where the transistor is N channel type) are stored in the memory function body, a threshold value of the entire transistor is decreased down to a value determined by the impurity concentration in the channel forming region (region 192) under the gate electrode. More specifically, the threshold value in the erased state does not depend on the impurity concentration in the P type highly-concentrated region 191, whereas the threshold value in the written state is largely influenced thereby. Therefore, disposing the P type highly-concentrated region 191 under the memory function bodies and adjacent to the source/drain region largely changes the threshold value only in the written state, thereby enabling remarkable increase of memory effect (difference of threshold values in the erased state and the written state).

Ninth Embodiment

Figure 15:
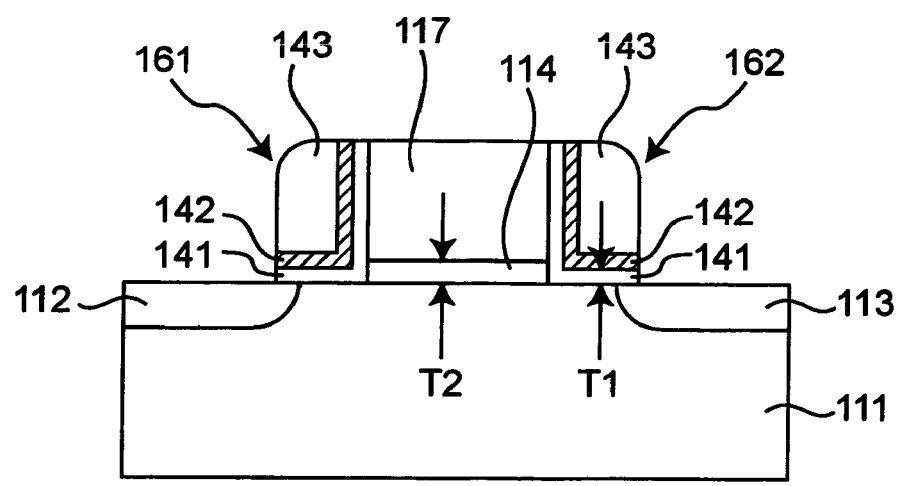
FIG. 15 is a schematic sectional view showing the structure of a semiconductor storage device according to a ninth embodiment of the invention.

A semiconductor storage element in a ninth embodiment has essentially the same structure as that in the fourth embodiment, except that in the ninth embodiment, the thickness, T1, of the insulating film that separates the charge retaining portion (silicon nitride film 142) from the channel forming region or the well region is smaller than the thickness, T2, of the gate insulating film, as shown in FIG. 15.

The gate insulating film 114 has a lower limit of the thickness T2 because of the request for withstand voltage in memory rewrite operations. However, the thickness T1 of the insulating film can be smaller than T2 regardless of the request for withstand voltage.

In the semiconductor storage element in the present embodiment, the thickness T1 of the insulating film has high design freedom as stated above because of the following reason. In the semiconductor storage element in the present embodiment, the insulating film that separates the charge retaining portion from the channel forming region or the well region is not interposed between the gate electrode and the channel forming region or well region. Consequently, the insulating film that separates the charge retaining portion from the channel forming region or the well region does not receive direct influence from the high electric fields that act upon a region between the gate electrode and the channel forming region or the well region, but receives influence from relatively weak electric fields expanding from the gate electrode in horizontal direction. As a result, despite the request for withstand voltage of the gate insulating film, it becomes possible to make T1 smaller than T2. Contrary to this, for example in EEPROM as typified by flash memory, an insulating film that separates a floating gate from the channel forming region or the well region is interposed between a gate electrode (control gate) and the channel forming region or the well region, so that the insulating film receives direct influence from high electric fields of the gate electrode. In EEPROM, therefore, the thickness of the insulating film that separates the floating gate from the channel forming region or the well region is limited, which hinders optimization of the functions of a memory device. As is apparent from the above, an essential reason of high freedom of T1 is the fact that the insulating film that separates the charge retaining portion from the channel forming region or the well region in the memory device of Embodiment 6 is not interposed between the gate electrode 117 and the channel forming region or the well region.

Decreasing the thickness T1 of the insulating film facilitates injection of electric charges into the memory function bodies, decreases voltage for write operations and erase operations, or enables high-speed write operations and erase operations. In addition, since an electric charge amount induced in the channel forming region or the well region increases when electric charges are stored in the silicon nitride film 142, an increased memory effect can be implemented.

Some electric lines of force in the memory function body, which have a short length, do not pass the silicon nitride film 142 as shown with arrow 184 in FIG. 15. Since electric field strength is relatively large on such a short electric line of force, the electric fields along the electric line of force play an important role in rewrite operations. By decreasing the thickness T1 of the insulating film, the silicon nitride film 142 moves to the lower side of the FIG. 15, so that the electric line of force shown with the arrow 183 passes the silicon nitride film 142. As a consequence, an effective dielectric constant in the memory function body along the electric line of force 184 becomes large, which makes it possible to make potential difference between both ends of the electric line of force 184 smaller. Therefore, most part of voltage applied to the gate electrode 117 is used to strengthen the electric fields in the offset region, thereby implementing high-speed write operations and erase operations.

As is clear from the above, due to the relationship of T1<T2, it is possible to decrease voltage in write operations and erase operations or implement high-speed write operations and erase operations, and to enable further increase of memory effect without degrading the voltage withstanding capability of the memory.

It is noted that the thickness T1 of the insulating film is preferably at least 0.8 nm, which is a limit at which uniformity in manufacturing process or certain level of film quality is maintained and holding characteristics do not suffer extreme deterioration.

Tenth Embodiment

Figure 16:
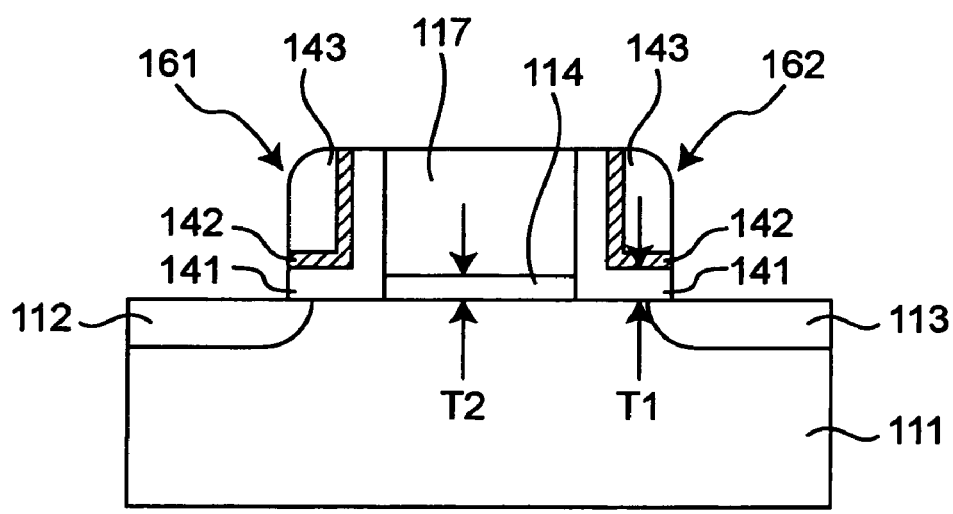
FIG. 16 is a schematic sectional view showing the structure of a semiconductor storage device according to a tenth embodiment of the invention.

A semiconductor storage element in a tenth embodiment has essentially the same structure as that in the fourth embodiment except that the thickness T1 of the insulating film that separates the charge retaining portion (silicon nitride film 142) from the channel forming region or the well region is larger than the thickness T2 of the gate insulating film, as shown in FIG. 16.

The gate insulating film 114 has an upper limit of the thickness T2 because of the request for prevention of short channel effect of the device. However, the thickness T1 of the insulating film is allowed to be larger than T2 regardless of the request for prevention of short channel effect.

In the semiconductor storage element of the present tenth embodiment, the thickness T1 of the insulating film has high design freedom as stated above because, as is already described, the insulating film that separates the charge retaining portion from the channel forming region or the well region is not interposed between the gate electrode and the channel forming region or the well region. As a result, despite the demand for prevention of short channel effect on the gate insulating film, it becomes possible to make T1 larger than T2.

Increasing T1 makes it possible to prevent dissipation of the electric charges stored in the memory function bodies and to improve holing or retaining characteristics of the memory.

Therefore, setting T1>T2 enables improvement of holding characteristics without increasing short channel effect of the memory.

It is noted that the thickness T1 of the insulating film is preferably 20 nm or less in consideration of prevention of reduction of a rewrite speed.

Eleventh Embodiment

FIGS. 17A-17D show another procedure for compositely forming the semiconductor switching elements 31 (only one of which is shown) in the logic circuit area 4 and the semiconductor storage elements 32 (only one of which is shown) in the memory area 5 on one semiconductor substrate 1. More specifically, it is shown that, after the formation of the gate electrode 3 and before the deposition of the material 10 for forming the charge retaining portion 11 on the gate side surfaces, a photolithography step and a dopant implantation step subsequent thereto are performed to selectively form LDD regions at a location where a normal-structure MOSFET is to be formed, thus making it possible to form the semiconductor switching element 31 and the semiconductor storage element 32 simply and concurrently without requiring any complex process.

Until the LDD region formation step, the same steps as in the second embodiment may be used. Therefore, the same steps are neither illustrated nor explained any more. That is, the structure shown in FIG. 4B is formed by using the steps shown in the second embodiment, and thereafter photoresist is removed.

Figure 17A:
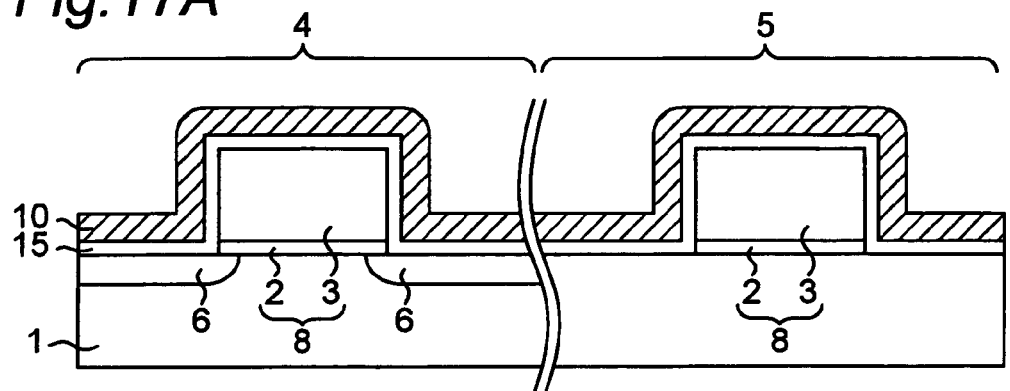
FIGS. 17A-17D are schematic sectional views showing the manufacturing process of a semiconductor storage device according to an eleventh embodiment of the invention.

Next, as shown in FIG. 17A, a first insulating film 15 is formed at a generally uniform thickness on the gate stack 8 and exposed surfaces of the semiconductor substrate 1. This first insulating film 15, which becomes an insulator through which electrons are passed, is preferably given by a film which has a high withstand voltage, small leakage current and high reliability. For example, an oxide film such as a thermal oxide film, $N_2O$ film, or NO film is used as in the case of the gate insulator 2. With the use of such an oxide film, the film thickness is preferably about 1 nm to 20 nm. Further, with the insulating film 15 formed at such a thinness that a tunnel current passes therethrough, the voltage required for charge injection/erase can be made lower, by which a reduction in power consumption can be achieved. Typically, the film thickness in that case is preferably about 1 nm to 5 nm. Now, since the formation of the first insulating film 15 causes the charge retaining portions 11 to come into contact with the semiconductor substrate 1 and the gate electrode 3 via the first insulating film 15, leakage of retained charges can be suppressed by this insulating film. Thus, a semiconductor storage element 32 superior in charge retention characteristic and high in long-term reliability is formed.

Next, the nitride film 10 is deposited at a generally uniform thickness entirely on the first insulating film 15. This nitride film may be replaced with a material such as oxynitride or oxide having charge traps, or a material such as a ferroelectric capable of inducing electric charge to the surfaces of the charge retaining portions by polarization or other phenomena, or a material such as floating polysilicon or silicon dots contained in an oxide film. That is, any material that is capable of retaining or inducing electric charges is usable instead of the nitride film. The film thickness of the nitride film 10 has only to be about 2 nm to 100 nm.

Figure 17B:
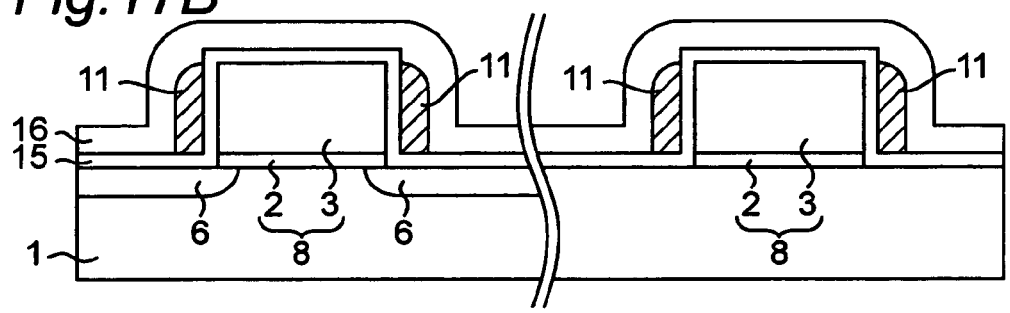

Next, as shown in FIG. 17B, charge retaining portions 11 are formed on the side walls of the gate stack 8 via the first insulating film 15, and further a second insulating film 16 is deposited thereon. An example of the formation method of the charge retaining portions 11 and the deposition method of the second insulating film 16 will be explained below.

First, the material 10 for forming the charge retaining portions is anisotropically etched, by which side-wall shaped charge retaining portion 11 is formed on the side faces of the gate stack 8 with the first insulating film 15 placed therebetween. In this case, the etching may appropriately be performed under such conditions that allow the material 10 for forming the charge retaining portions to be selectively etched and that include a large etching selection ratio of the material 10 to the first insulating film 15. Next, a second insulating film 16 is formed at a generally uniform thickness on the entire exposed surfaces of the first insulating film 15 and the charge retaining portion 11. This second insulating film 16 is preferably given by a film which employs HTO (High Temperature Oxide) or other CVD (Chemical Vapor Deposition) oxide and which offers good step coverage. With the use of an HTO film, the film thickness has only to be about 5 nm to 100 nm.

However, in the case where a material containing a substance having electrical conductivity such as conductor or semiconductor is used as the material 10 of the charge retaining portion, it is necessary that, after the formation of the charge retaining portion 11, the charge retaining portion 11 surrounding the gate electrode 3 should be made into separate charge retaining portions 11, 11 which are placed on the right and left of the gate electrode 3 and which are electrically insulated from each other. Therefore, as shown in FIG. 19B, portions (removal regions 21) are removed from the annular charge retaining portion 11 by etching. These removal regions 21 are shown at phantom-line hatched portions in front and rear portions of the annular charge retaining portion 11. A removal method therefor is to pattern the photoresist by using known photolithography process so that the charge retaining portion 11 except the removal regions is covered therewith. Thereafter, by performing anisotropic etching, the removal regions 21 that are exposed portions of the charge retaining portion 11 are removed. This etching may appropriately be performed under such conditions that allow the charge retaining portions 11 to be selectively etched and that provide a large etching selection ratio of the charge retaining portion 11 to the first insulating film 15. It is noted that the removal regions 21 are preferably positioned on the device isolation regions of the substrate.

Figure 17C:
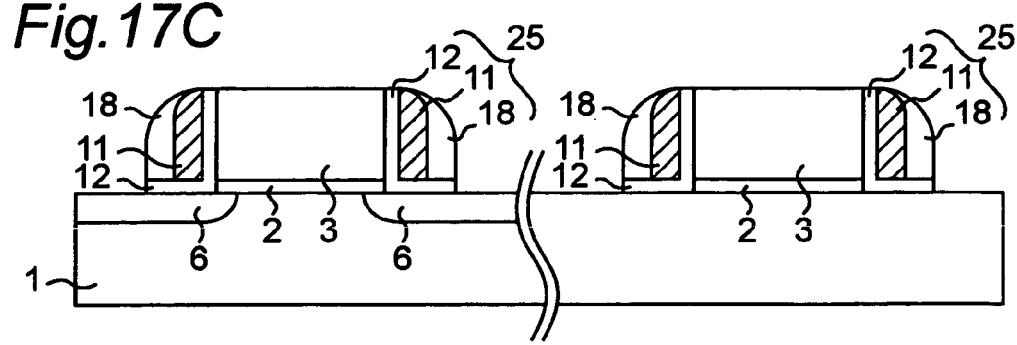

Next, as shown in FIG. 17C, the first insulating film 15 and the second insulating film 16 are anisotropically etched, by which the first insulator 12 is formed on the side faces of the gate stack 8. Further, the second insulator 18 is formed, with the first insulator 12 and the charge retaining portion 11 disposed between the second insulator and the gate electrode. In this way, a memory function body 25 composed of the first insulator 12 (first insulating film 15), the charge retaining portion 11, and the second insulator 18 (second insulating film 16) is completed. In this case, the etching may appropriately be performed under such conditions that allow the first insulating film 15 and the second insulating film 16 to be selectively etched and that provide a large etching selection ratio of the insulating films to the gate electrode 3 as well as to the semiconductor substrate 1. Although not shown, the second insulating film 16 may be anisotropically etched until the charge retaining portion 11 is exposed. In this case, the anisotropic etching may appropriately be performed under the foregoing conditions or under such conditions that allow the first insulating film 15 and the second insulating film 16 to be selectively etched and that provide a large etching selection ratio of the insulating films to the charge retaining portion 11, the gate electrode 3 and the semiconductor substrate 1.

Figure 17D:
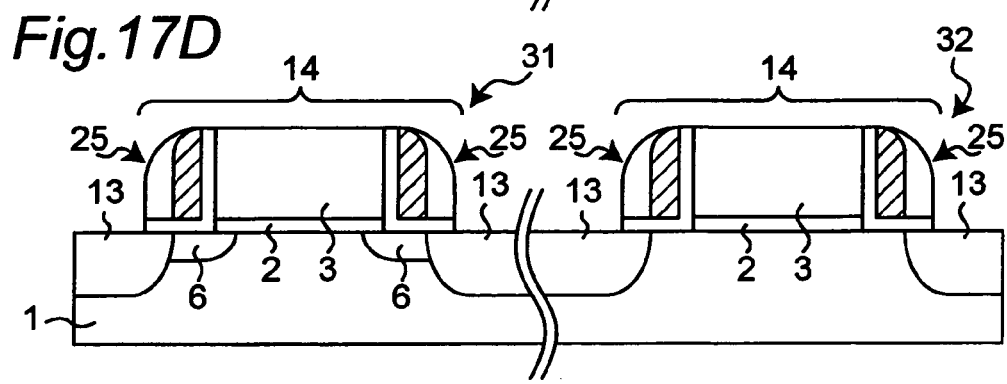

Next, as shown in FIG. 17D, with the gate electrode 3 and the memory function bodies 25, 25 on both sides thereof being used as an integral mask 14, source/drain implantation is performed, by which the source/drain regions 13 are formed in a self-alignment fashion.

With the use of the above-described process, the semiconductor switching element 31 of a normal-structure MOSFET having LDD regions to be used for the logic circuit area 4, and the semiconductor storage element 32 of a nonvolatile memory element to be used for the memory area 5, can be concurrently formed on one substrate only by adding a simple process step and without employing any complex process steps.

Also, when electric charge is retained in the charge retaining portions 11, part of the channel forming region is strongly affected by the charge, causing the drain current value to change. Thus, a nonvolatile memory element that is distinguishable between the presence and absence of electric charge according to the change in drain current value can be realized.

By providing the gate insulator 2 and the charge retaining portion 11 independently of each other, a memory cell transistor having a short-channel effect of similar level to that of normal-structure MOSFETs can be formed concurrently with and by the same manufacturing process as the normal-structure MOSFETs. Therefore, the process of compositely forming the logic circuit area 4 and the memory area 5 is carried out quite simply.

According to this nonvolatile memory element, while the 2-bit storage per transistor is realized, the short-channel effect can be reduced to a large extent, so that further scale-down becomes achievable. Further, higher-speed operation and lower-power consumption can be realized.

Also, since the charge retaining portion 11 is in contact with the semiconductor substrate 1 and the gate electrode 3 via the first insulating film 15, leakage of the retained charge can be suppressed by this insulating film 15. Thus, a nonvolatile memory element with good charge retention characteristics and long-term reliability is realized.

Also, since the charge retaining portions 11 are I-shaped, the charge retaining portions can be made even smaller in scale. Therefore, the charge retaining portions 11 can be formed in vicinities of the channel, thus facilitating erasure, or removal of electrons that have been injected into the portions for programming. Thus, erasure failure is prevented. Further, scaling down the charge retaining portions allows the charge erasure to be efficiently achieved, so that a nonvolatile memory element with fast read and erase speeds and high reliability can be realized.

In the case where a conductor or semiconductor is used as the charge retaining portions 11, applying a positive voltage to the gate electrode 3 causes polarization in the charge retaining portions 11, which in turn causes electrons to be induced in vicinities of the side faces of the gate electrode 3, so that the amount of electrons in vicinities of the channel forming region decreases. Thus, the injection of electrons from the substrate 1 or the source/drain regions 13 can be accelerated, so that a nonvolatile memory element fast in write speed and high in reliability can be formed.

Twelfth Embodiment

FIGS. 18A-18D show still another procedure for compositely forming the semiconductor switching elements 31 (only one of which is shown) in the logic circuit area 4 and the semiconductor storage elements 32 (only one of which is shown) in the memory area 5 on one semiconductor substrate 1. More specifically, it is shown that, after the formation of the gate electrode 3 and before the deposition of the material 10 for forming the charge retaining portion 11 on the gate side surfaces, a photolithography step and a dopant implantation step subsequent thereto are performed to selectively form LDD regions at a location where a normal-structure MOSFET is to be formed, thus making it possible to form the semiconductor switching element 31 and the semiconductor storage element 32 simply and concurrently without requiring any complex process.

Until the LDD region formation step, the same steps as in the second embodiment may be used. Therefore, the same steps are neither illustrated nor explained any more. That is, the structure shown in FIG. 4B is formed by using the steps shown in the second embodiment, and thereafter photoresist is removed. Thereafter, the structure shown in FIG. 17A is formed in the manner described in connection with the eleventh embodiment.

Figure 18A:
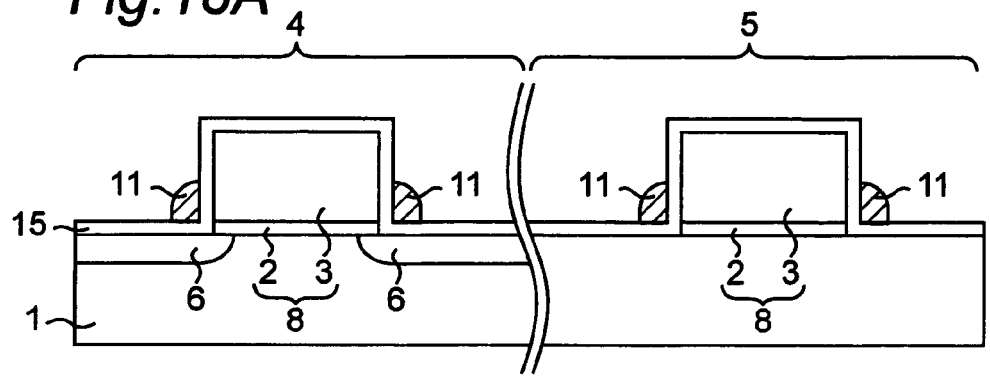
FIGS. 18A-18D are schematic sectional views showing the manufacturing process of a semiconductor storage device according to a twelfth embodiment of the invention.

Next, as shown in FIG. 18A, the material 10 for forming the charge retaining portion is anisotropically etched, by which a side-wall shaped charge retaining portion 11 is formed on the side faces of the gate stack 8 via the first insulating film 15. The charge retaining portion 11 of this embodiment is characterized in that the charge retaining portion 11 is formed with a larger etching amount, i.e. lower in height, as compared with the charge retaining portions 11 of the fourth embodiment. That is, the charge retaining portion 11 is formed such that the topmost position of the charge retaining portion 11 is below the topmost position of the gate electrode 3. Desirably, the height of the charge retaining portion 11 after the etching is about 1 nm to 12 nm. Further, the lateral width of the charge retaining portion 11 is desirably about 1 nm to 12 nm. In this case, the etching may appropriately be performed under such conditions that allow the material 10 for forming the charge retaining portion to be selectively etched and that provide a large etching selection ratio of the material 10 to the first insulating film 15. Since forming the first insulating film 15 causes the charge retaining portion 11 to be in contact with the semiconductor substrate 1 and the gate electrode 3 via the first insulating film 15, leakage of the retained charge is suppressed by this insulating film 15. Thus, a nonvolatile memory element good at charge retention characteristic and high in long-term reliability can be realized.

However, in the case where a material containing a substance having electrical conductivity such as conductor or semiconductor is used as the material 10 of the charge retaining portion, it is necessary that, after the formation of the charge retaining portion 11, the charge retaining portion 11 surrounding the gate electrode 3 should be made into separate charge retaining portions 11, 11 which are placed on the right and left of the gate electrode 3 and which are electrically insulated from each other. Therefore, as shown in FIG. 19B, portions (removal regions 21) are removed from the annular charge retaining portion 11 by etching. These removal regions 21 are shown as phantom-line hatched portions in front and rear positions of the annular charge retaining portion 11. A removal method therefor is to pattern the photoresist by using a known photolithography process so that the charge retaining portion 11 except the removal regions is covered therewith. Thereafter, by performing anisotropic etching, the removal regions 21 that are exposed portions of the charge retaining portion 11 are removed. This etching may appropriately be performed under such conditions that allow the charge retaining portions 11 to be selectively etched and that provide a large etching selection ratio of the charge retaining portion 11 to the first insulating film 15. It is noted that the removal regions 21 are preferably positioned on the device isolation regions of the substrate.

Figure 18B:
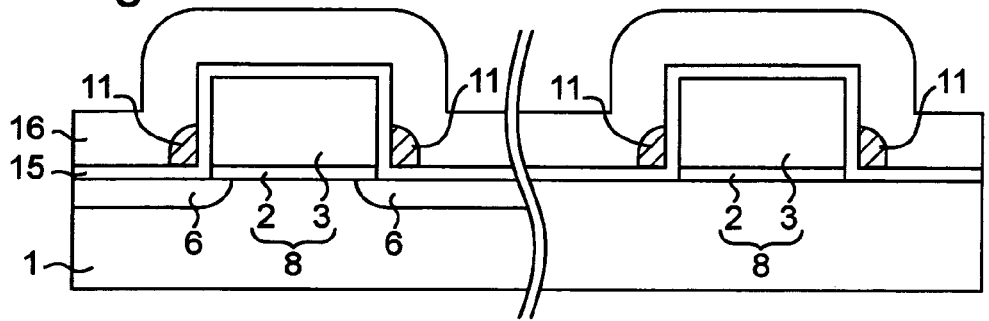

Next, as shown in FIG. 18B, a second insulating film 16 is formed at a generally uniform thickness on the entire exposed surfaces of the first insulating film 15 and the charge retaining portion 11. This second insulating film 16 is preferably given by a film which employs HTO (High Temperature Oxide) or other CVD (Chemical Vapor Deposition) oxide and which offers good step coverage. With the use of an HTO film, the film thickness has only to be about 5 nm to 100 nm.

Figure 18C:
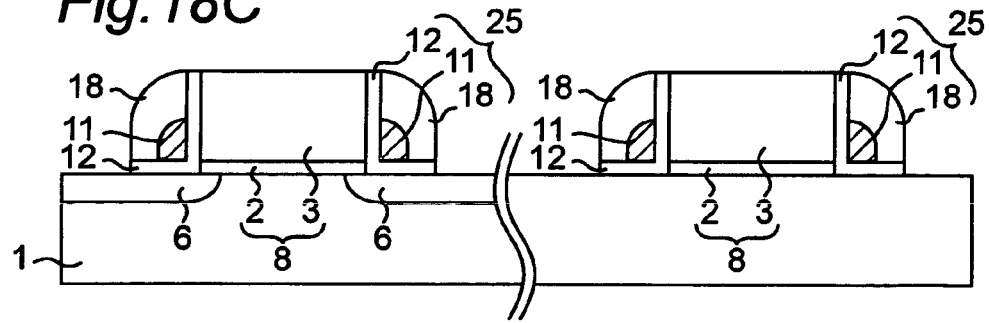

Next, as shown in FIG. 18C, the first insulating film 15 and the second insulating film 16 are anisotropically etched, by which the first insulator 12 is formed on the side faces of the gate stack 8. Further, the second insulator 18 is formed, with the first insulator 12 and the charge retaining portion 11 disposed between the second insulator and the gate electrode. In this way, a memory function body 25 composed of the first insulator 12 (first insulating film 15), the charge retaining portion 11, and the second insulator 18 (second insulating film 16) is completed. In this case, the etching may appropriately be performed under such conditions that allow the first insulating film 15 and the second insulating film 16 to be selectively etched and that provide a large etching selection ratio of the insulating films to the gate electrode 3 as well as to the semiconductor substrate 1. At this time, the etching should be performed such that the topmost position of the charge retaining portion 11 is lower than that of the first insulator 12 (first insulating film 15).

Figure 18D:
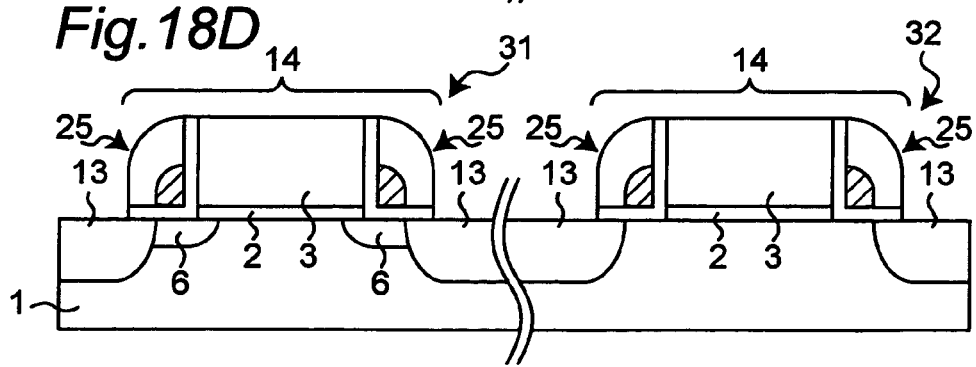

Next, as shown in FIG. 18D, with the gate electrode 3 and the memory function bodies 25, 25 on both sides thereof being used as an integral mask 14, source/drain implantation is performed, by which the source/drain regions 13 are formed in a self-alignment fashion.

With the use of the above-described process, the semiconductor switching element 31 of a normal-structure MOSFET having LDD regions to be used for the logic circuit area 4, and the semiconductor storage element 32 of a nonvolatile memory element to be used for the memory area 5, can be concurrently formed on one substrate only by adding a simple process step and without employing any complex process steps.

Also, when electric charges are retained in the charge retaining portions 11, part of the channel forming region is strongly affected by the charges, causing the drain current value to change. Thus, a nonvolatile memory element that is distinguishable between the presence and absence of electric charge according to the change in drain current value can be realized.

By providing the gate insulator 2 and the charge retaining portion 11 independently of each other, a memory cell transistor having a short-channel effect of similar level to that of normal-structure MOSFETs can be formed concurrently with and by the same manufacturing process as the normal-structure MOSFETs. Therefore, the process of compositely forming the logic circuit area 4 and the memory area 5 is carried out quite simply.

According to this nonvolatile memory element, while the 2-bit storage per transistor is realized, the short-channel effect can be reduced to a large extent, so that further scale-down becomes achievable. Further, higher-speed operation and lower-power consumption can be realized.

Also, since the charge retaining portion 11 is in contact with the semiconductor substrate 1 and the gate electrode 3 via the first insulating film 15, leakage of the retained charge can be suppressed by this insulating film 15. Thus, a nonvolatile memory element with good charge retention characteristics and long-term reliability is realized.

Also, since the charge retaining portions 11 are I-shaped or dot-shaped, the charge retaining portions can be made even smaller in scale. Therefore, the charge retaining portions 11 can be formed in vicinities of the channel, thus facilitating erasure, or removal of electrons that have been injected into the portions for programming. Thus, erasure failure is prevented. Further, scaling down the charge retaining portions allows the charge erasure to be efficiently achieved, so that a nonvolatile memory element with fast read and erase speeds and high reliability can be realized.

In the case where a conductor or semiconductor is used as the charge retaining portions 11, applying a positive voltage to the gate electrode 3 causes polarization in the charge retaining portions 11, which in turn causes electrons to be induced in vicinities of the side faces of the gate electrode 3, so that the amount of electrons in vicinities of the channel forming region decreases. Thus, the injection of electrons from the substrate 1 or the source/drain regions 13 can be accelerated, so that a nonvolatile memory element fast in write speed and high in reliability can be formed.

Figure 24:
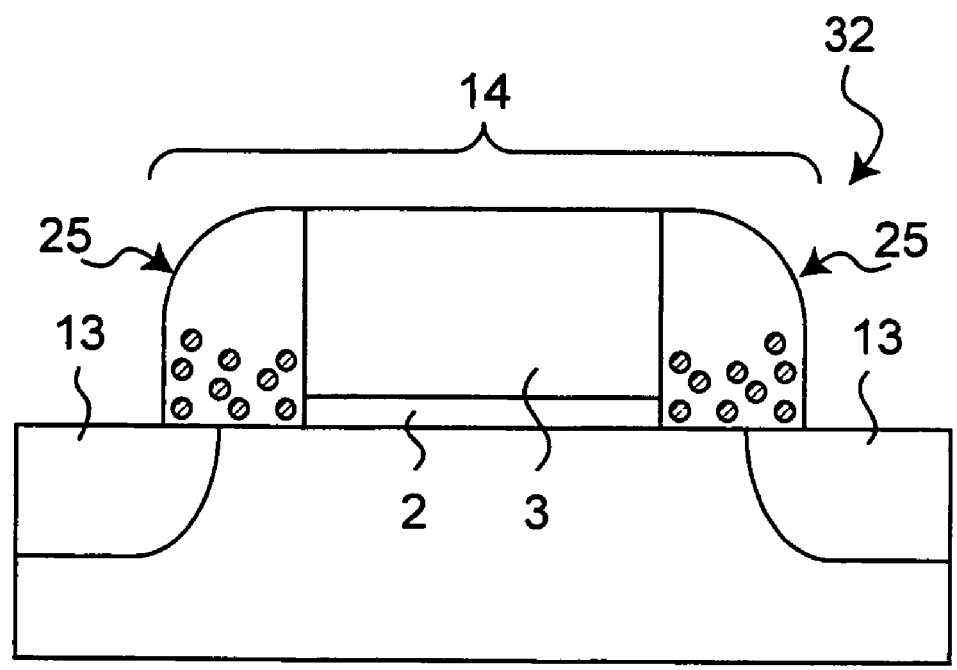
FIG. 24 is a schematic sectional view showing the structure of a semiconductor storage element according to an embodiment of the invention in which a charge retaining portion is constructed of a plurality of fine particles.

Further, according to this embodiment, the charge retaining portions 11 can be formed into nano-dot configuration. That is, as shown in FIG. 24, the memory function body 25 is composed of fine particles of a material having a function of storing electric charges and an insulator having a function of preventing dissipation of stored electric charge. It is noted here that the term "fine particles" refers to the charge retaining portion 11, while the term "insulator" refers to the first insulator 12 (first insulating film 15) and the second insulator 18 (second insulating film 16). Accordingly, the charge retaining portion can be further scaled down and formed in vicinities of the channel, thus facilitating erasure, or removal of electrons that have been injected into the charge retaining portions for programing. Thus, erase failure can be prevented. Further, since the charge retaining portion 11 is configured in nano-dots, the memory effect is greatly improved by the coulomb blockade effect. Thus, a nonvolatile memory element greatly fast in read speed, high in reliability, good at charge retention characteristic and high in long-term reliability can be realized.

Thirteenth Embodiment

Figure 22A:
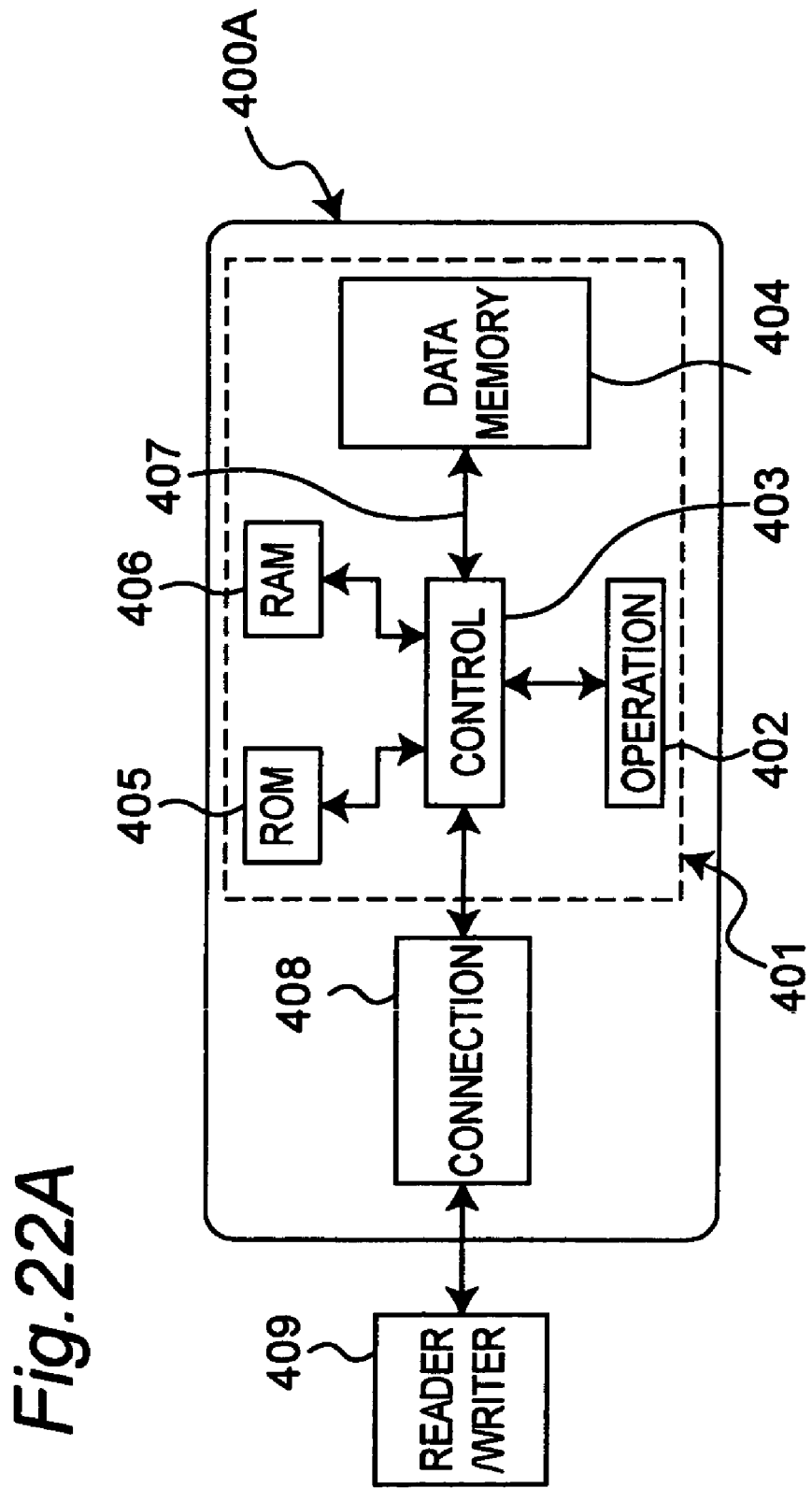
FIGS. 22A and 22B are schematic block diagrams of IC cards according to a thirteenth embodiment of the invention.
Figure 22B:
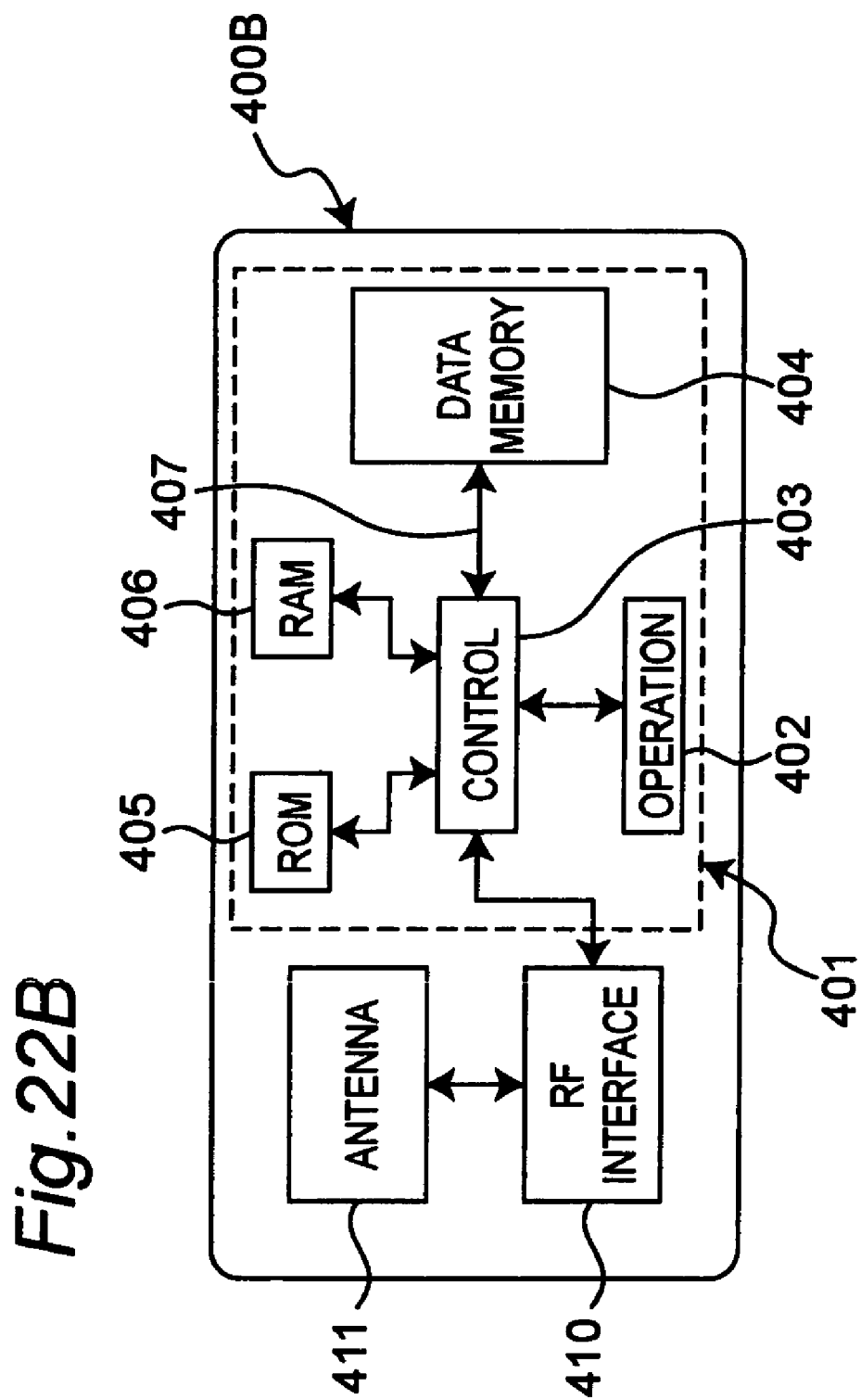

FIGS. 22A and 22B show the structure of each of IC cards 400A and 400B according to a thirteenth embodiment of the present invention.

The IC card 400A shown in FIG. 22A has a built-in MPU (Micro Processing Unit) 401 and a built-in connection section 408. The MPU 401 has a data memory section 404, an operation section 402, a control section 403, a ROM (Read Only Memory) 405, and a RAM (Random Access Memory) 406, all of these being formed in one chip. Programs for operating the MPU 401 are stored in the ROM 405. The RAM 406 is used as a work area and temporarily stores operation data. The MPU 401 has the semiconductor device according to the present invention. The constituent parts or sections 402, 403, 404, 405, 406, and 408 are connected with one another via lines (including a data bus and a power source line) 407. When the IC card 400A is placed in position in the reader/writer 409, the connection section 408 and the reader/writer 409 are connected to each other, so that the IC card 400A is energized and data exchange is performed.

The IC card 400A is characterized in that the MPU 401 incorporates the data memory section 404 and that the semiconductor switching elements and the semiconductor storage elements are placed together in one semiconductor chip.

The aforementioned semiconductor storage elements 30, 31, 41, 51A-51C, or 61A-61D that enable the reduction of production costs are used in the data memory section 404. These storage elements are easy to miniaturize and allow two-bit operations. This facilitates reduction of the area of a memory cell array having such storage elements arrayed, and the memory cell array can be fabricated at reduced cost. Use of such a memory cell array in the data memory section 404 of the IC card 400A would reduce the cost of the IC card.

Further, because the MPU 401, which incorporates the data memory section 404, is formed in one chip, the production cost of the IC card can be largely reduced.

Further, because the MPU 401 has the semiconductor device according to the present invention, more specifically, the data memory section 404 uses the semiconductor storage elements and other circuits use the semiconductor switching elements, the fabrication process of the IC card is considerably simplified, as compared with a case in which the data memory section 404 uses flash memories. The reason for that is that the fabrication process for the semiconductor storage elements in the data memory section 404 is very similar to the fabrication process for the semiconductor switching elements in the logic circuits (i.e., operation section 402 and control section 403), so that it is very easy to place those storage elements and switching elements on one chip in a composite manner. Thus, incorporation of the data memory section 404 in the MPU 401 on one chip leads to a considerable cost reduction.

The ROM 405 may be constructed of the above-described semiconductor storage elements. This makes it possible to externally rewrite the ROM 405, which brings about remarkable increase of the functions of the IC card. Because the above semiconductor storage elements are easy to miniaturize and allow two-bit operations, substituting these semiconductor storage elements for the memory cells of the masked ROM would hardly cause increase of a chip area. Also, the process for forming the semiconductor storage elements is almost the same as the general CMOS forming process, which facilitates mixed-placing of the semiconductor storage elements with the logic circuit.

Referring next to FIG. 22B, the IC card 400B incorporates an MPU section 401, an RF interface section 410, and an antenna section 411. The MPU section 401 contains a data memory section 404, an operation section 402, a control section 403, a ROM 405, and a RAM 406, all of these being formed in one chip. The sections 402, 403, 404, 405, 406, 410, and 411 are connected to one another via lines (including a data bus and a power source line) 407.

The IC card 400B of FIG. 22B is different from the IC card 400A of FIG. 22A in that the IC card 400B is of non-contact type. Consequently, the control section 403 is connected not to the connection section but to the antenna section 411 via the RF interface section 410. The RF interface section 410 has a function of communicating with external equipment and a power collection function. The RF interface section 410 has a function of commutating high-frequency signals transmitted from the antenna section 411 and feeding power, and a function of modulating and demodulating signals. It is noted that the RF interface section 410 and the antenna section 411 may be placed together with the MPU 401 in one chip.

Since the IC card 400B is of non-contact type, it becomes possible to prevent electrostatic destruction which would occur through the connection section. Also, the IC card does not necessarily need to have a close contact with an external apparatus, which makes freedom of applications large. In addition, the semiconductor storage elements constituting the data memory section 404 each operate at low supply voltage (approx. 9V), compared with conventional flash memory cells (supply voltage of approx. 12V), which enables downsizing of the circuit of the RF interface section 410 and enables cost reduction.

Fourteenth Embodiment

The semiconductor device of the present invention is applicable to battery-driven portable electronic equipment, especially to handheld terminals or personal digital assistances (PDAs). The portable electronic equipment include, for example, PDAs, mobile phones, game machines.

Figure 23:
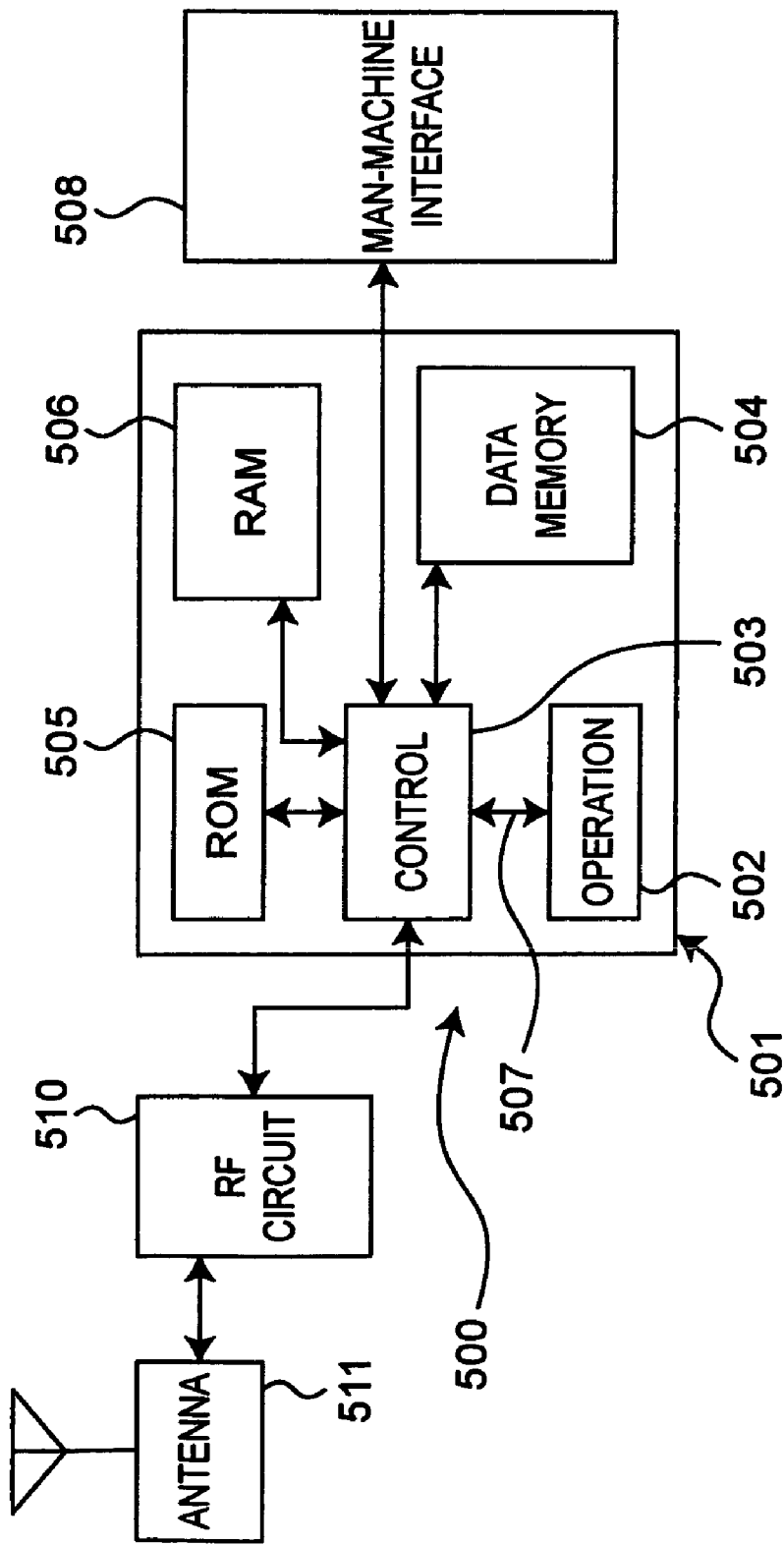
FIG. 23 is a schematic block diagram of a mobile phone according to a fourteenth embodiment of the invention.

FIG. 23 shows a block diagram of a mobile phone 500 according to an embodiment of the present invention.

The mobile phone 500 incorporates an MPU section 501, a man-machine interface section 508, an RF circuit section 510, and an antenna section 511. The MPU section 501 has a data memory section 504, an operation section 502, a control section 503, a ROM 505, and a RAM 506, all of these being formed in one chip. Programs for operating the MPU 501 are stored in the ROM 505. The RAM 506 is used as a work area and temporarily stores operation data. The semiconductor device according to the present invention is incorporated in the MPU 501. The constituent parts or sections 502, 503, 504, 505, 506, 508, 510 and 511 are connected with one another via lines (including a data bus and a power source line) 507.

The mobile phone 500 is characterized in that the MPU 501 incorporates the data memory section 504 and that the semiconductor switching elements and the semiconductor storage elements are placed together in one semiconductor chip.

The aforementioned semiconductor storage elements 30, 31, 41, 51A-51C, or 61A-61D that enable the reduction of production costs are used in the data memory section 504. These storage elements are easy to miniaturize and allow two-bit operations. This facilitates reduction of the area of a memory cell array having such storage elements arrayed, and the memory cell array can be fabricated at reduced cost. Use of such a memory cell array in the data memory section 504 of the mobile phone 500 would reduce the cost of the mobile phone.

Further, because the MPU 501, which incorporates the data memory section 504, is formed in one chip, the production cost of the mobile phone can be largely reduced.

Further, because the MPU 501 has the semiconductor device according to an embodiment of the present invention, more specifically, the data memory section 504 uses the semiconductor storage elements and other circuits use the semiconductor switching elements, the fabrication process is considerably simplified, as compared with a case in which the data memory section 504 uses flash memories. The reason for that is that the fabrication process for the semiconductor storage elements in the data memory section 504 is very similar to the fabrication process for the semiconductor switching elements in the logic circuits (i.e., operation section 502 and control section 503), so that it is very easy to place those storage elements and switching elements on one chip in a composite manner. Thus, incorporation of the data memory section 504 in the MPU 501 and placement thereof on one chip leads to a considerable cost reduction.

The ROM 505 may be constructed of the above-described semiconductor storage elements. This makes it possible to externally rewrite the ROM 505, which brings about remarkable increase of the functions of the mobile phone. Because the above semiconductor storage elements are easy to miniaturize and allow two-bit operations, substituting these semiconductor storage elements for the memory cells of the masked ROM would hardly cause increase of a chip area. Also, the process for forming the semiconductor storage elements is almost the same as the general CMOS forming process, which facilitates mixed-placement of the semiconductor storage elements and the logic circuit in one chip.

As is apparent from above, application of the semiconductor device of embodiments of the present invention to a portable electronic device as typified by the mobile phone 500 contributes to a reduction in production cost of a control circuit of the electronic device and hence in cost of the portable electronic device itself, or contributes to an increase in number of the semiconductor storage elements included in such a control circuit so as to improve the overall function of the portable electronic equipment.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device wherein a logic circuit area having a semiconductor switching element and a memory area having a semiconductor storage element are disposed on one semiconductor substrate;
    wherein each of the semiconductor switching element and the semiconductor storage element has no more than one gate electrode, a pair of source/drain regions of first conductivity type formed on portions of a semiconductor substrate surface corresponding to opposite sides of the gate electrode, and a channel forming region of second conductivity type formed between the source/drain regions;
    wherein memory function bodies having a function of storing electric charges are provided on the opposite sides of the gate electrode of the semiconductor storage element; and
    wherein in the semiconductor storage element, an amount of current that flows from one of the source/drain regions to the other of the source/drain regions upon application of a voltage to the gate electrode is variable depending on an amount of electric charges retained in the memory function body;
    wherein
    in the semiconductor switching element, the source/drain regions extend under and overlap with the gate electrode with respect to a channel direction; and
    in the semiconductor storage element, spacings are provided between the gate electrode and each of the source/drain regions with respect to the channel direction, and the memory function bodies having the function of storing electric charges are disposed on the opposite sides of the gate electrode so as to overlap with the spacings at the semiconductor substrate surface, respectively.

2. The semiconductor device as claimed in claim 1, wherein memory function bodies identical to the memory function bodies of the semiconductor storage element are provided on the opposite sides of the gate electrode of the semiconductor switching element.

3. The semiconductor device as claimed in claim 1, wherein
    the memory function bodies are side wall spacers provided on side faces of the gate electrode.

4. The semiconductor device as claimed in claim 1, wherein
    portions of the source/drain regions of the semiconductor switching element that extend under the gate electrode are lower in dopant concentration than other portions of the source/drain regions that are located outside the gate electrode and the memory function bodies.

5. An IC card having the semiconductor device as defined in claim 1.

6. Portable electronic equipment having the semiconductor device as defined in claim 1.

7. The semiconductor device as claimed in claim 1, wherein
    the memory function body comprises a charge retaining portion made of a material having a function of storing electric charges, and an anti-dissipation insulator having a function of preventing dissipation of stored charges; and
    the anti-dissipation insulator has a first insulator that is disposed between the charge retaining portion and the gate electrode and between the charge retaining portion and the semiconductor substrate.

8. The semiconductor device as claimed in claim 7, wherein
    the anti-dissipation insulator further has a second insulator which is associated with the first insulator to sandwich the charge retaining portion.

9. The semiconductor device as claimed in claim 7, wherein
    a topmost position of the charge retaining portion is below a topmost position of the gate electrode.

10. The semiconductor device as claimed in claim 7, wherein
    a topmost position of the charge retaining portion is below a topmost position of the first insulator.

11. The semiconductor device as claimed in claim 7, wherein
    the charge retaining portion comprises a plurality of fine particles having a function of storing electric charge.

12. The semiconductor device as claimed in claim 7, wherein
    in the semiconductor storage element, at least part of the charge retaining portion overlaps with part of the associated source/drain region.

13. The semiconductor device as claimed in claim 7, wherein
    the charge retaining portion has a surface generally parallel to a surface of a gate insulator formed just under the gate electrode.

14. The semiconductor device as claimed in claim 7, wherein
    the charge retaining portion has a surface generally parallel to a side face of the gate electrode.

15. The semiconductor device as claimed in claim 7, wherein
    a film thickness of the first insulator is thinner than a film thickness of a gate insulator formed just under the gate electrode but not less than 0.8 nm.

16. The semiconductor device as claimed in claim 7, wherein
a film thickness of the first insulator is thicker than a film thickness of a gate insulator formed just under the gate electrode but not more than 20 nm.

17. A semiconductor device wherein a logic circuit area having a semiconductor switching element and a memory area having a semiconductor storage element are disposed on one semiconductor substrate;
wherein each of the semiconductor switching element and the semiconductor storage element has a gate electrode, a pair of source/drain regions of first conductivity type formed on portions of a semiconductor substrate surface corresponding to opposite sides of the gate electrode, and a channel forming region of second conductivity type formed between the source/drain regions;
wherein memory function bodies having a function of storing electric charges are provided on the opposite sides of the gate electrode of the semiconductor storage element;
wherein in the semiconductor storage element, an amount of current that flows from one of the source/drain regions to the other of the source/drain regions upon application of a voltage to the gate electrode is variable depending on an amount of electric charges retained in the memory function body and, wherein
memory function bodies identical to the memory function bodies of the semiconductor storage element are provided on the opposite sides of the gate electrode of the semiconductor switching element.

18. The semiconductor device as claimed in claim 17, wherein
the memory function bodies are side wall spacers provided on side faces of the gate electrode.

19. An IC card having the semiconductor device as defined in claim 17.

20. Portable electronic equipment having the semiconductor device as defined in claim 17.

21. The semiconductor device as claimed in claim 17, wherein
the memory function body comprises a charge retaining portion made of a material having a function of storing electric charges, and an anti-dissipation insulator having a function of preventing dissipation of stored charges; and
the anti-dissipation insulator has a first insulator that is disposed between the charge retaining portion and the gate electrode and between the charge retaining portion and the semiconductor substrate.

22. The semiconductor device as claimed in claim 21, wherein
the anti-dissipation insulator further has a second insulator which is associated with the first insulator to sandwich the charge retaining portion.

23. The semiconductor device as claimed in claim 21, wherein
a topmost position of the charge retaining portion is below a topmost position of the gate electrode.

24. The semiconductor device as claimed in claim 21, wherein
a topmost position of the charge retaining portion is below a topmost position of the first insulator.

25. The semiconductor device as claimed in claim 21, wherein
the charge retaining portion comprises a plurality of fine particles having a function of storing electric charge.

26. The semiconductor device as claimed in claim 21, wherein
in the semiconductor storage element, at least part of the charge retaining portion overlaps with part of the associated source/drain region.

27. The semiconductor device as claimed in claim 21, wherein
the charge retaining portion has a surface generally parallel to a surface of a gate insulator formed just under the gate electrode.

28. The semiconductor device as claimed in claim 21, wherein
the charge retaining portion has a surface generally parallel to a side face of the gate electrode.

29. The semiconductor device as claimed in claim 21, wherein
a film thickness of the first insulator is thinner than a film thickness of a gate insulator formed just under the gate electrode but not less than 0.8 nm.

30. The semiconductor device as claimed in claim 21, wherein
a film thickness of the first insulator is thicker than a film thickness of a gate insulator formed just under the gate electrode but not more than 20 nm.

* * * * *